United States Patent
Kimura et al.

[11] Patent Number: 6,018,539
[45] Date of Patent: Jan. 25, 2000

[54] SEMICONDUCTOR LASER AND METHOD OF FABRICATING SEMICONDUCTOR LASER

[75] Inventors: Tatsuya Kimura; Motohalu Miyashita; Yutaka Mihashi, all of Tokyo, Japan

[73] Assignee: Mitsubishi Denki Kabushiki Kaisha, Tokyo, Japan

[21] Appl. No.: 09/020,857

[22] Filed: Feb. 9, 1998

[30] Foreign Application Priority Data

Jan. 10, 1997 [JP] Japan ..................................... 9-02683

[51] Int. Cl.⁷ ....................................................... H01S 3/19
[52] U.S. Cl. ............................................................. 372/45
[58] Field of Search ................................................ 372/45

[56] References Cited

U.S. PATENT DOCUMENTS

| | | | |
|---|---|---|---|
| 5,678,935 | 10/1997 | Sakata | 372/45 |
| 5,684,818 | 11/1997 | Anayama et al. | 372/45 |
| 5,703,974 | 12/1997 | Sasaki et al. | 372/45 |
| 5,799,027 | 8/1998 | Anayama et al. | |

FOREIGN PATENT DOCUMENTS

| | | |
|---|---|---|
| 63-263787 | 10/1988 | Japan . |
| 837341 | 2/1996 | Japan . |

OTHER PUBLICATIONS

Lammert et al.; "Strained–layer InGaAs–GaAs–AlGaAs buried–heterostructure lasers with nonabsorbing mirrors by selective–area MOCVD", Electronics Letters, Jun. 22, 1995, vol. 31, No. 13, pp. 1070–1072.

*Primary Examiner*—Rodney Bovernick
*Assistant Examiner*—Robert E. Wise
*Attorney, Agent, or Firm*—Leydig, Voit & Mayer, Ltd.

[57] ABSTRACT

A semiconductor laser includes a first conductivity type semiconductor substrate having a gain region and a spot size changing region adjacent each other; a first conductivity type lower cladding layer disposed on the substrate; an active layer disposed on the lower cladding layer and having a thickness which is uniform in the gain region and gradually decreases in the spot size changing region with distance from the gain region; a second conductivity type upper cladding layer disposed on the active layer and having a stripe-shaped ridge, the ridge extending along the gain region and the spot size changing region; a first electrode disposed on the ridge of the upper cladding layer; and a second electrode disposed on a rear surface of the substrate. Current flow is concentrated in the ridge of the upper cladding layer. Further, when the ridge is fabricated, portions of the active layer in which a current will be injected during operation of the laser are not exposed to the atmosphere and not oxidized, resulting in a highly reliable semiconductor laser with an integrated spot size changing part and gain part.

15 Claims, 19 Drawing Sheets

6,018,539

SEMICONDUCTOR LASER AND METHOD OF FABRICATING SEMICONDUCTOR LASER

FIELD OF THE INVENTION

The present invention relates to semiconductor lasers and methods for fabricating the semiconductor lasers. More particularly, the invention relates to a spot-size changeable, short-wavelength semiconductor laser comprising an integrated spot size changing part and gain part.

BACKGROUND OF THE INVENTION

FIG. 11 is a perspective view illustrating a short-wavelength semiconductor laser having an oscillation wavelength of 0.98 μm. In the figure, reference numeral 1 designates an n type GaAs substrate having a (001) surface orientation. There are successively disposed on the (001) surface of the GaAs substrate 1, an n type GaAs buffer layer 2 having a carrier concentration of $1\times10^{18}$ cm$^{-3}$, a 1.5 μm thick n type AlGaAs lower cladding layer 3 having a carrier concentration of $1\times10^{18}$ cm$^{-3}$, an undoped multiquantum well (MQW) active layer 4 comprising InGaAs layers and GaAs layers alternatingly arranged, a 1.5 μm thick p type AlGaAs upper cladding layer 16 having a carrier concentration of $1\times10^{17}$cm$^{-3}$, and a 0.5 μm thick p type GaAs contact layer 8 having a carrier concentration of $1\times10^{19}$ cm$^{-3}$. Two grooves, each about 20 μm wide, penetrate through the contact layer 8 and reach into the upper cladding layer 16, extending along the cavity length direction of the laser. A region sandwiched between these grooves is a ridge structure 10. The ridge structure 10 is about 1 μm wide at the top. An insulating film 11, such as SiO$_2$, is disposed on the contact layer 8 and on the inner surfaces of the grooves. This insulating film 11 has an aperture 11a about 1 μm wide on the upper flat surface of the ridge structure 10. A p side electrode 12 is disposed over the insulating film 11, covering the aperture 11a. That is, the p side electrode 12 is in ohmic contact with the contact layer 8 through the aperture 11a. An n side electrode 13 is disposed on the rear surface of the substrate 1. Further, the laser has a pair of cavity facets 14 perpendicular to the longitudinal direction of the ridge structure 10.

FIGS. 12(a)–12(d) are cross-sectional views illustrating process steps in a method of fabricating the semiconductor laser shown in FIG. 11. In the figures, the same reference numerals as those shown in FIG. 11 designate the same or corresponding parts. Hereinafter, the fabrication method will be described using FIGS. 12(a)–12(d).

Initially, as shown in FIG. 12(a), the n type GaAs buffer layer 2, the n type AlGaAs cladding layer 3, the MQW active layer 4, the p type AlGaAs upper cladding layer 16, and the p type GaAs contact layer 8 are successively grown on the n type GaAs substrate 1 in the wafer state by MOCVD (Metal Organic Chemical Vapor Deposition).

In the step of FIG. 12(b), an SiO$_2$ film is deposited over the entire surface of the contact layer 8 by sputtering, and the SiO$_2$ film is patterned by an exposure technique and an etching technique, for example, wet etching using a hydrofluoric acid based etchant or dry etching using CF$_4$ gas, thereby forming an SiO$_2$ mask pattern 15 having parallel two grooves 15a extending in what becomes the cavity length direction of the laser. The width of the center portion of the mask pattern 15 sandwiched between the two grooves 15a is about 1 μm, and the width of the groove 15a is about 20 μm.

In the step of FIG. 12(c), using the mask pattern 15, the p type GaAs contact layer 8 and an upper portion of the p type AlGaAs upper cladding layer 16 are wet-etched using a tartaric acid based etchant. The etching depth is 1.1 μm. As a result of the etching, the ridge structure 10 is formed under the center portion of the mask pattern 15.

After removal of the mask pattern 15, as shown in FIG. 12(d), an insulating film, such as an SiO$_2$ film, is again deposited over the entire surface of the substrate by sputtering, and an aperture about 1 μm wide is formed in the insulating film on the upper flat surface of the ridge structure 10 using a photolithographic technique, thereby forming an insulating film 11 having an aperture 11a.

Thereafter, the p side electrode 12 is formed on the insulating film 11 and on the contact layer 8 exposed in the aperture 11a, and the n side electrode 13 is formed on the rear surface of the substrate 1. Finally, the cavity facets 14 are formed by cleaving, and the wafer is divided into individual elements, completing a semiconductor laser as shown in FIG. 11.

A description is given of the operating principle of the semiconductor laser. Holes supplied from the p side electrode are concentrated in the ridge structure 10, which has a trapezoidal cross section perpendicular to the cavity length direction, and efficiently injected into the active layer 4. Meanwhile, electrons are injected into the active layer 4 from the n side electrode 13. In the active layer 4, holes and electrons recombine to produce light. In the direction perpendicular to the surface of the substrate 1 (hereinafter referred to as "vertical direction"), the light is confined in the active layer 4 by the upper and lower cladding layers 3 and 16 disposed on and beneath the active layer 4. In the direction parallel to the surface of the substrate 1 and perpendicular to the cavity length direction (hereinafter referred to as "horizontal direction"), the light is confined in the ridge structure 10 due to the distribution of effective refractive indices in the horizontal direction because there exists air, of which refractive index is smaller than that of a semiconductor layer, on both sides of the ridge structure 10.

The far field radiation angle of the laser light emitted from the cavity facet 14 of the semiconductor laser in the direction perpendicular to the surface of the substrate 1 is 27°, and the radiation angle in the direction parallel to the surface of the substrate 1 is 8°. That is, the far field is an oval that is longer in the vertical direction. When this laser light is coupled with an optical fiber, the coupling efficiency is 20~30% degraded as compared with a case where circular laser light is coupled with an optical fiber. Therefore, in order to obtain a sufficient coupling efficiency between laser light and an optical fiber using the conventional semiconductor laser, the output power of laser light must be increased. However, high-power output operation very likely deteriorates the semiconductor laser, resulting in a reduction in reliability.

Further, in the semiconductor laser, since laser light is confined in and guided through the active layer 4, the light emitting spot at the cavity facet 14 is small, so that the laser light widely spreads when emitted from the cavity facet. Since the spot size of the emitted laser light is large, a lens for coupling the laser light with an optical fiber must be disposed between the semiconductor laser and the optical fiber, resulting in an increase in assembly cost because process steps of positioning and fixing the lens are required.

Further, when the conventional semiconductor laser oscillates at a high power, about 200 mW, COD (Catastrophic Optical Damage) may occur because of light absorption at the cavity facet. This means that the reliability of the laser degrades with the passage of time.

The above-mentioned problems are solved in a spot size changeable semiconductor laser in which a gain part generating light and a spot size changing part are integrated, which laser is disclosed in, for example, Electronics Letters, Vol.31 (1995), p.1071.

FIG. 21 shows a perspective view of a semiconductor laser disclosed in Japanese Published Patent Application (examined) No. Hei.8-31652. This semiconductor laser is fabricated as follows. A pair of stripe-shaped $SiO_2$ films 69 are formed on a prescribed region of a p type GaAs substrate 61 so that a stripe-shaped portion of the substrate 61 is exposed between the films 69 and, using the $SiO_2$ films 69 as masks for selective growth, a p type $Al_xGa_{1-x}As$ cladding layer 62, a p type $Al_yGa_{1-y}As$ active layer 63, an n type $Al_xGa_{1-x}As$ cladding layer 64, and an n type GaAs contact layer 65 are grown on the substrate 61. In the semiconductor laser so fabricated, since the active layer 63 is thinner in a region adjacent the cavity facet of the laser than in another region, the amount of light leaking from the active layer 63 into the upper and lower cladding layers increases in the vicinity of the facet, so that the light emitting spot at the facet increases and the width of a radial beam emitted from the facet narrows. In addition, since the light density at the laser facet is reduced, COD hardly occurs, whereby high-power output operation is achieved.

FIG. 13(a) is a perspective view illustrating a conventional spot-size changeable semiconductor laser, and FIG. 13(b) is a cross-sectional view taken along a line 13b—13b in FIG. 13(a). This semiconductor laser is a long-wavelength semiconductor laser in which a spot size changing part 200 and a gain part 300 for generating laser light are integrated on an n type InP substrate 101. There are successively disposed on the n type InP substrate 101, an n type InP lower cladding layer 102, an undoped MQW active layer 103 comprising, alternatingly arranged, two kinds of InGaAsP layers of different compositions, and a p type InP first upper cladding layer 104. The first upper cladding layer 104, the active layer 103, and the lower cladding layer 102 form a stripe-shaped ridge structure 113 having a prescribed width. P type InP current blocking layers 105 and n type InP current blocking layers 106 are disposed on both sides of the ridge structure 113 to bury the ridge structure 113. A p type InP second upper cladding layer 107 is disposed on the ridge structure 113 and on the n type InP current blocking layer 106, and a p type InGaAs contact layer 108 is disposed on the second upper cladding layer 107. The lower cladding layer 102, the active layer 103, and the first upper cladding layer 104 have uniform thicknesses in the gain part 300. In the spot size changing part 200, the thicknesses of these layers gradually decrease with distance from the gain part 300. A p side electrode 109 is disposed on the contact layer 108 in the gain part 300. An n side electrode 110 is disposed on the rear surface of the substrate 101.

FIGS. 14(a)–14(d) are perspective views illustrating process steps in a method of fabricating the spot-size changeable semiconductor laser shown in FIGS. 13(a) and 13(b). In these figures, reference numeral 300a designates a gain region on the substrate 101 where the gain part 300 will be produced, and reference numeral 200a designates a spot size changing region on the substrate 101 where the spot size changing part 200 will be produced.

Initially, as shown in FIG. 14(a), an insulating film comprising $SiO_2$ or the like is deposited over the n type InP substrate 101, and prescribed portions of the insulating film are removed using exposure and etching techniques, thereby forming a mask pattern 111 for selective growth. The mask pattern 111 comprises a pair of insulating films having stripe-shaped (rectangle) surfaces and extending in the direction along which the gain region 300a and the spot size changing region 200a are arranged, i.e., in what becomes the cavity length direction of the laser. Further, these insulating films are disposed parallel to each other with a prescribed spacing between them.

In the step of FIG. 14(b), using the insulating films 111 as masks, the lower cladding layer 102, the MQW active layer 103, and the first upper cladding layer 104 are successively grown on the substrate 101 by MOCVD. During the MOCVD growth, since the masks 111 are present on the substrate 101, the growth rate of the crystalline semiconductor varies on the surface of the substrate 101. To be specific, the growth rate is higher on the region between the masks 111 in the gain region 300a than on the spot size changing region 200a. Further, on the spot size changing region 200a, the growth rate gradually decreases with distance from the masks 111. As a result, the respective semiconductor layers grown on the substrate 101 have uniform thicknesses in the gain region 300a and, in the spot size changing region 200a, the thicknesses of the semiconductor layers gradually decrease, relative to those in the gain region 300a, with distance from the gain region 300a.

In the step of FIG. 14(c), after removal of the masks 111, a mask 112 is formed on the first upper cladding layer 104. The mask 112 is a stripe having a prescribed width and extending in what becomes the cavity length direction of the laser. Using the mask 112 as a mask for selective etching, wet etching is carried out from the surface of the first upper cladding layer 104 until reaching the substrate 101, thereby forming the ridge structure 113 under the mask 112.

In the step of FIG. 14(d), using the mask 112 as a mask for selective growth, the p type InP current blocking layers 105 and the n type InP current blocking layers 106 are successively grown on the substrate 101 so that the ridge structure 113 is buried in the current blocking layers 105 and 106.

After removal of the mask 112, the second upper cladding layer 107 and the contact layer 108 are successively grown on the ridge structure 113 and on the n type InP current blocking layers 106. Thereafter, the p side electrode 109 is formed on the contact layer 108 in the gain region 300a, and the n side electrode 110 is formed on the rear surface of the substrate 101. Finally, cavity facets are formed by cleaving, completing a semiconductor laser as shown in FIG. 13(a).

In the spot size changeable semiconductor laser so fabricated, in the gain part 300, holes supplied from the p side electrode 109 are concentrated in the stripe-shaped ridge structure 113 having a uniform width and then efficiently injected into the active layer 103. In the active layer 103, holes recombine with electrons which are injected from the n side electrode 110, thereby to produce light. This light is guided though the active layer 103 and input to the spot size changing part 200.

In the spot size changing part 200, since the thickness of the active layer 103 gradually decreases in approaching the cavity facet, the amount of light leaking from the active layer 104 into the lower cladding layer 102 and the first and second upper cladding layers 104 and 107 increases in approaching the cavity facet. Therefore, in the spot size changing part 200, the laser light expands in the vertical direction in approaching the cavity facet. As a result, the light emitting spot at the cavity facet broadens in the vertical direction, whereby the width of the far field pattern of the laser light emitted from the facet narrows. Accordingly, in the conventional semiconductor laser, it is possible to make the far field of laser light approximately circular, whereby the coupling efficiency between the laser light and an optical fiber or the like is improved.

Further, in the spot size changing part 200, since laser light traveling through the active layer expands in the vertical direction in approaching closer to the cavity facet, the emission spot of laser light at the cavity facet is increased and the spot size of laser light emitted from the cavity facet is reduced, so that the laser light can be directly applied to an optical fiber or the like. Since it is not necessary to use a lens for reducing the spot size between the optical fiber and the semiconductor laser, the assembly cost is reduced.

Furthermore, since the amount of laser light confined in the active layer 103 is reduced at the cavity facet in the spot size changing part 200, the light density at the cavity facet is lowered, whereby COD caused by light absorption at the cavity facet during high-power output operation can be avoided. As a result, the reliability of the semiconductor laser with the passage of time is improved.

However, in the spot size changeable semiconductor laser shown in FIG. 13(*a*) wherein the active layer 103 is included in the ridge structure 113 for concentrating the current flow, when the ridge structure 113 is formed by etching and the current blocking layer 102 is re-grown on both sides of the ridge structure 113, side surfaces of the active layer 103 that become re-growth interfaces are exposed to air and oxidized. If the semiconductor laser has such oxidized portions of the active layer 103 to which a current is injected, the energy band gap becomes narrower in the oxidized portions than in the other portions of the active layer, so that some of light generated by current injection into the active layer 103 during the laser operation is absorbed in the oxidized portions, locally increasing the temperature of the laser. If the temperature rises sufficiently, the semiconductor layers contacting both sides of the active layer 103 may begin to melt, resulting in destruction of the internal structure of the semiconductor laser and rapid deterioration of the laser characteristics. As a result, the reliability with the passage of time is degraded.

In the semiconductor laser shown in FIG. 13(*a*), especially when a mixed crystal semiconductor material containing Al and Ga is used as a material of the active layer to shorten the wavelength of emitted light, oxidation very likely occurs at the side surfaces of the active layer that become re-growth interfaces because Al is an easily oxidizable material. So, it is very difficult to obtain sufficient reliability with the passage of time.

SUMMARY OF THE INVENTION

It is an object of the present invention to provide a highly reliable semiconductor laser in which a spot size changing part and a gain part are integrated on one substrate.

It is another object of the present invention to provide a method of fabricating the semiconductor laser.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the invention, a semiconductor laser comprises a first conductivity type semiconductor substrate having a gain region and a spot size changing region which are arranged adjacent each other; a first conductivity type lower cladding layer disposed on the front surface of the substrate; an active layer disposed on the lower cladding layer and having a thickness which is uniform in the gain region and gradually decreases in the spot size changing region with distance from the gain region; a second conductivity type upper cladding layer disposed on the active layer and having a stripe-shaped ridge at its surface, the ridge extending in the direction along which the gain region and the spot size changing region are arranged; a first electrode disposed on the ridge of the upper cladding layer with a second conductivity type contact layer intervening; and a second electrode disposed on the rear surface of the substrate. Therefore, current flow is concentrated in the ridge of the upper cladding layer. Further, when the ridge is fabricated, portions of the active layer in which a current will be injected during operation of the laser are not exposed to the atmosphere, so that these portions of the active layer are not oxidized, resulting in a highly reliable semiconductor laser in which a spot size changing part and a gain part are integrated on a substrate.

According to a second aspect of the invention, in the above-mentioned semiconductor laser, the lower cladding layer comprises a first lower cladding layer and a second lower cladding layer disposed on the first lower cladding layer; the first lower cladding layer has a uniform thickness; and the second lower cladding layer has a thickness being uniform in the gain region and gradually decreasing in the spot size changing region with distance from the gain region. Therefore, the curve of the active layer in the direction perpendicular to the substrate between the spot size changing part and the gain part is reduced, whereby the light guide direction and the laser light emitting direction are approximately parallel to the surface of the substrate. Moreover, since the thickness of the first lower cladding layer is uniform, the spacing between the active layer in which light is guided and the substrate is sufficient even in the spot size changing part, thereby preventing laser light from being absorbed in the substrate. As a result, degradation in laser characteristics is avoided.

According to a third aspect of the invention, in the above-mentioned semiconductor laser, the second lower cladding layer is thinner than the first lower cladding layer. Therefore, the curve of the active layer in the direction perpendicular to the substrate between the spot size changing part and the gain part is further reduced, whereby the light guide direction and the laser light emitting direction are more parallel to the surface of the substrate.

According to a fourth aspect of the invention, in the above-mentioned semiconductor laser, the upper cladding layer comprises a first upper cladding layer, and a second upper cladding layer disposed on the first upper cladding layer and having a ridge at its surface; the first upper cladding layer has a thickness being uniform in the gain region and gradually decreasing in the spot size changing region with distance from the gain region; and the second upper cladding layer has a uniform thickness. Since the thickness of the second upper cladding layer is uniform, the spacing between the active layer in which light is guided and the contact layer is sufficient even in the spot size changing part, thereby preventing laser light from being absorbed in the contact layer. As a result, degradation in laser characteristics is avoided.

According to a fifth aspect of the invention, in the above-mentioned semiconductor laser, the first upper cladding layer is thinner than the second upper cladding layer. Therefore, the spacing between the active layer and the contact layer in the spot size changing region is further increased, thereby preventing laser light from being absorbed in the contact layer. As a result, degradation in laser characteristics is avoided.

According to a sixth aspect of the invention, in the above-mentioned semiconductor laser, the ridge of the upper cladding layer has a width that is uniform in the gain region and gradually decreases in the spot size changing region with distance from the gain region. Therefore, light confinement in the horizontal direction becomes weaker with the decrease in the ridge width. As a result, the width of the far field in the horizontal direction can be easily controlled, whereby the effect of making the far field circular is improved.

According to a seventh aspect of the invention, the above-mentioned semiconductor laser further comprises a first conductivity type current blocking layer which is disposed on the second upper cladding layer at both sides of the ridge so that the ridge is buried in the current blocking layer. Therefore, in the horizontal direction, light is confined using the current blocking layer comprising a crystalline semiconductor, whereby the output power of the laser is increased.

According to an eighth aspect of the invention, in the above-mentioned semiconductor laser, the active layer has a quantum well structure; the substrate, lower cladding layer, active layer, and upper cladding layer form a pair of cavity facets that is perpendicular to the direction along which the ridge of the second upper cladding layer extends; and the active layer has a portion where the quantum well structure is disordered, in the vicinity of the cavity facet on the side of the spot size changing region. Therefore, light absorption at the cavity facet is avoided, providing a semiconductor laser capable of high-power output operation.

According to a ninth aspect of the invention, in the above-mentioned semiconductor laser, the lower cladding layer, active layer, and upper cladding layer disposed in the gain region are positioned in the center of the width direction of the substrate. Therefore, it is possible to provide a highly reliable semiconductor laser in which a spot size changing part and a gain part are integrated on a substrate.

According to a tenth aspect of the invention, in the above-mentioned semiconductor laser, the active layer comprises a mixed crystal semiconductor layer comprising at least one of Al and Ga. Therefore, it is possible to provide a highly reliable semiconductor laser in which a spot size changing part and a gain part are integrated on a substrate.

According to an eleventh aspect of the invention, a method of fabricating a semiconductor laser comprises preparing a first conductivity type semiconductor substrate having a gain region and a spot size changing region which are arranged adjacent each other; and forming, on the substrate, a first conductivity type lower cladding layer, an active layer having a thickness which is uniform in the gain region and gradually decreases in the spot size changing region with distance from the gain region, and a second conductivity type upper cladding layer having a stripe-shaped ridge at its surface, the ridge extending in the direction along which the gain region and the spot size changing region are arranged. Therefore, when the ridge structure for concentrating current flow is fabricated, portions of the active layer in which a current will be injected during operation are not exposed to the atmosphere, so that these portions of the active layer are not oxidized, resulting in a highly reliable semiconductor laser in which a spot size changing part and a gain part are integrated on a substrate.

According to a twelfth aspect of the invention, in the above-mentioned method, the active layer is grown using a mask pattern for selective growth, which mask pattern comprises two insulating films disposed on the substrate parallel to each other with a prescribed spacing between them, extending in the direction along which the gain region and the spot size changing region are arranged, and each of the insulating films has a first thickness being uniform in the gain region and a second thickness being zero or smaller than the first thickness in the spot size changing region. Therefore, it is possible to provide a highly reliable semiconductor laser in which a spot size changing part and a gain part are integrated on a substrate.

According to a thirteenth aspect of the invention, in the above-mentioned method, the lower cladding layer comprises a first lower cladding layer and a second lower cladding layer; the first lower cladding layer is grown over the substrate with a uniform thickness; and the second lower cladding layer is selectively grown on the first lower cladding layer using the mask for selective growth. Therefore, the first lower cladding layer has a uniform thickness while the second lower cladding layer has a thickness being uniform in the gain region and gradually decreasing in the spot size changing region with distance from the gain region. Accordingly, the curve of the active layer in the direction perpendicular to the substrate between the spot size changing part and the gain part is reduced, whereby the light guide direction and the laser light emitting direction are approximately parallel to the surface of the substrate. Moreover, since the thickness of the first lower cladding layer is uniform, the spacing between the active layer in which light is guided and the substrate is sufficient even in the spot size changing part, thereby preventing laser light from being absorbed in the substrate. As a result, degradation in laser characteristics is avoided.

According to a fourteenth aspect of the invention, in the above-mentioned method, the upper cladding layer comprises a first upper cladding layer and a second upper cladding layer; the first upper cladding layer is grown on the active layer using the mask for selective growth; the second upper cladding layer is grown on the first upper cladding layer after removal of the mask; and an upper portion of the second upper cladding layer is formed into a stripe-shaped ridge by selective etching. Therefore, the first upper cladding layer has a thickness being uniform in the gain region and gradually decreasing in the spot size changing region with distance from the gain region while the second upper cladding layer has a uniform thickness. Since the thickness of the second upper cladding layer is uniform, the spacing between the active layer in which light is guided and the contact layer is sufficient even in the spot size changing region, preventing laser light from being absorbed in the contact layer. As a result, degradation is laser characteristics is avoided.

According to a fifteenth aspect of the invention, in the above-mentioned method, the upper cladding layer comprises a first upper cladding layer and a second upper cladding layer; the first upper cladding layer is grown on the active layer using the mask for selective growth; and after removal of the mask, the second upper cladding layer is selectively grown on the first upper cladding layer so that it is shaped like a stripe ridge. In this method, since the height of the ridge depends on the thickness of the second upper cladding layer grown by crystal growth, the height of the ridge can be controlled with high precision. Therefore, the uniformity of the height of the ridge within the area of the substrate surface is improved, resulting in a high quality semiconductor laser.

DETAILED DESCRIPTION OF THE PREFERRED EMBODIMENTS

[Embodiment 1]

Figure 1:
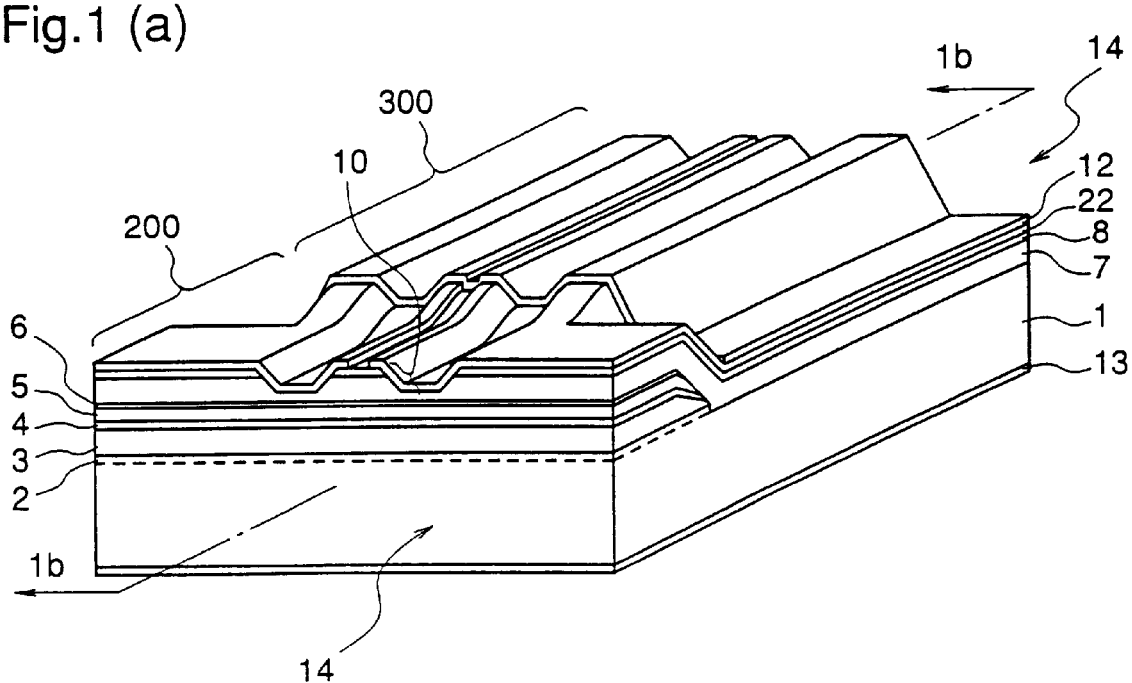
FIGS. 1(a) and 1(b) are a perspective view and a cross-sectional view, respectively, illustrating a semiconductor laser according to a first embodiment of the invention.
Figure 1:
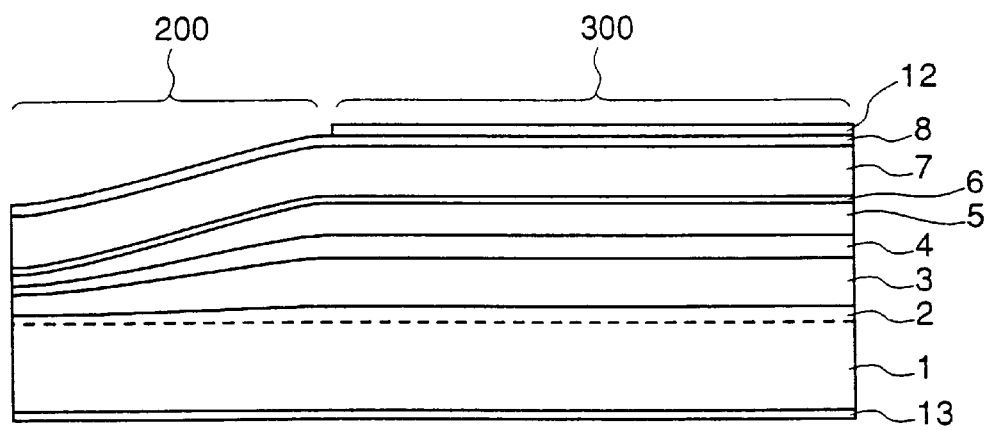

FIG. 1(a) is a perspective view illustrating a semiconductor laser according to a first embodiment of the invention, and FIG. 1(b) is a cross-sectional view taken along a line 1b–1b in FIG. 1(a). This semiconductor laser is a spot-size changeable, short-wavelength semiconductor laser having an oscillating wavelength of 0.98 $\mu$m, in which a spot size changing part 200 and a gain part 300 for generating laser light are integrated on a substrate. In FIGS. 1(a) and 1(b), reference numeral 1 designates an n type GaAs substrate having a (001) surface orientation. There are successively disposed on the (001) surface of the GaAs substrate 1, an n type GaAs buffer layer 2 having a carrier concentration of $1\times10^{18}$ cm$^{-3}$, a 1.5 $\mu$m thick n type AlGaAs lower cladding layer 3 having a carrier concentration of $1\times10^{18}$ cm$^{-3}$, an undoped multiquantum well (MQW) active layer 4 comprising InGaAs layers and GaAs layers alternatingly arranged, a 0.1 $\mu$m thick p type AlGaAs first upper cladding layer 5 having a carrier concentration of $1\times10^{18}$ cm$^{-3}$, a 10 nm thick p type GaAs cap layer 6 having a carrier concentration of $1\times10^{18}$ cm$^{-3}$, a 1.4 $\mu$m thick p type AlGaAs second upper cladding layer 7 having a carrier concentration of $1\times10^{18}$ cm$^{-3}$, and a 0.5 $\mu$m thick p type GaAs contact layer 8 having a carrier concentration of $1\times10^{19}$ cm$^{-3}$. The thicknesses mentioned above are measured at the thickest portions of the respective semiconductor layers. The lower cladding layer 3, the active layer 4, and the first upper cladding layer 5 have uniform thicknesses in the gain part 300. In the spot size changing part 200, the thicknesses of these layers gradually decrease with distance from the gain part 300. Since the cap layer 6 is very thin, no light is absorbed in the cap layer 6. So, the first upper cladding layer 5 and the second upper cladding layer 7 substantially correspond to a single upper cladding layer.

Two grooves, each about 20 $\mu$m wide, penetrate through the contact layer 8 and reach into the second upper cladding layer 7, extending in the direction along which the gain part 300 and the spot size changing part 200 are arranged, i.e., in the cavity length direction of the laser. A region between these grooves is a ridge structure 10. The width of the ridge structure 10 is about 1 $\mu$m at the top. On both sides of the ridge structure 10, two ridges as high as the ridge structure 10 and comprising the second upper cladding layer 7 and the contact layer 8 are disposed, across the two grooves, respectively. These ridges are for making the height of the semiconductor laser uniform so that the semiconductor laser can be stably fixed when it is mounted on a pedestal or the like with the upper surface of the substrate 1 facing the pedestal. An insulating film 22 comprising SiO$_2$ or the like is disposed on the contact layer 8. The insulating film 22 has an aperture 22b about 1 $\mu$m wide on the upper flat part of the ridge structure 10. A p side electrode 12 (first electrode) is disposed on the insulating film 22, covering the aperture 22a. Thereby, the p side electrode 12 is in ohmic contact with the contact layer 8 on the ridge structure 10 through the aperture 22a of the insulating film 22. That is, the p side electrode 12 is disposed on a region of the second upper cladding layer 7 having the three ridges, with the contact layer 8 intervening. An n side electrode 13 (second electrode) is disposed on the rear surface of the substrate 1. The laser has a pair of cavity facets 14 perpendicular to the longitudinal direction of the ridge structure 10. The length of the spot size changing part 200 in the cavity length direction is 150 $\mu$m, and the length of the gain part 300 in the cavity length direction is 900 $\mu$m.

FIGS. 2(a)–2(f) are perspective views illustrating process steps in a method of fabricating the semiconductor laser shown in FIGS. 1(a) and 1(b). In these figures, reference numeral 300a designates a gain region on the substrate 1 where the gain part 300 will be produced, and reference numeral 200a designates a spot size changing region on the substrate 1 where the spot size changing part 200 will be produced.

Figure 2:
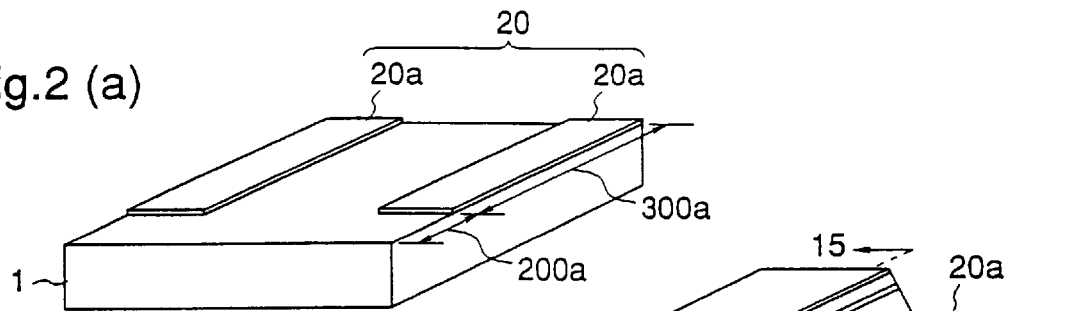
FIGS. 2(a)–2(f) are perspective views illustrating process steps in a method of fabricating the semiconductor laser according to the first embodiment.
Figure 2:
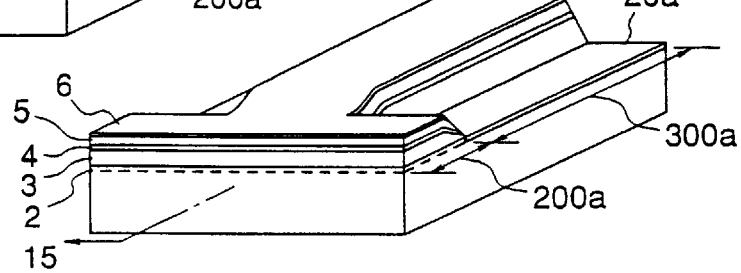
Figure 2:
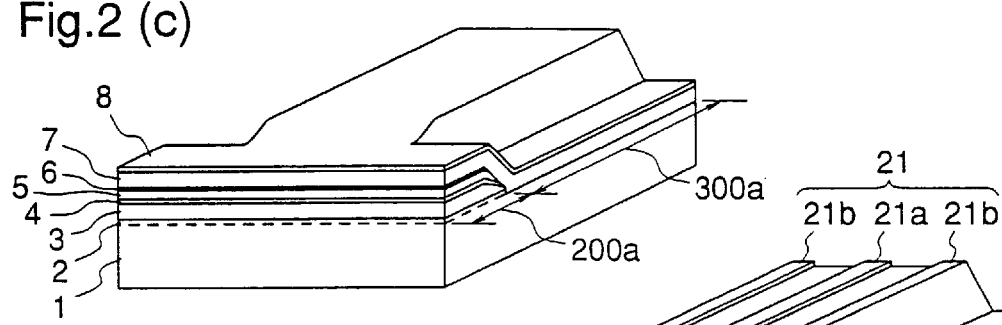
Figure 2:
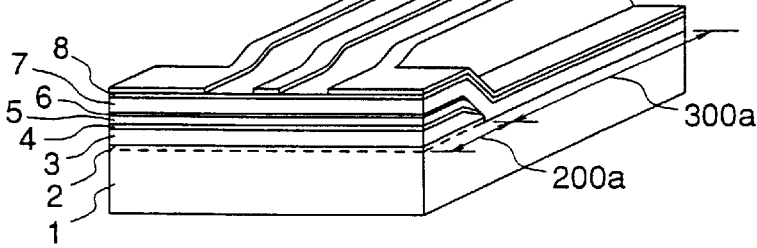
Figure 2:
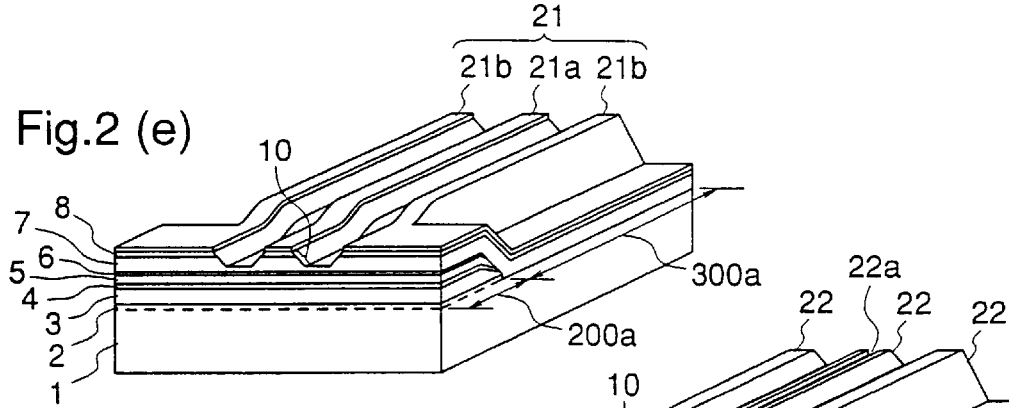
Figure 2:
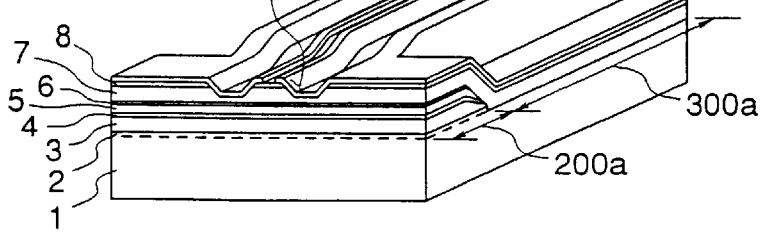

Initially, as shown in FIG. 2(a), an insulating film comprising SiO$_2$ or the like is deposited over the (001) surface of the n type GaAs substrate (wafer) 1 having the gain region 300a and the spot size changing region 200a, and prescribed portions of the insulating film are removed using exposure and etching techniques, thereby forming a mask pattern 20 for selective growth on the gain region 300a.

Figure 3:
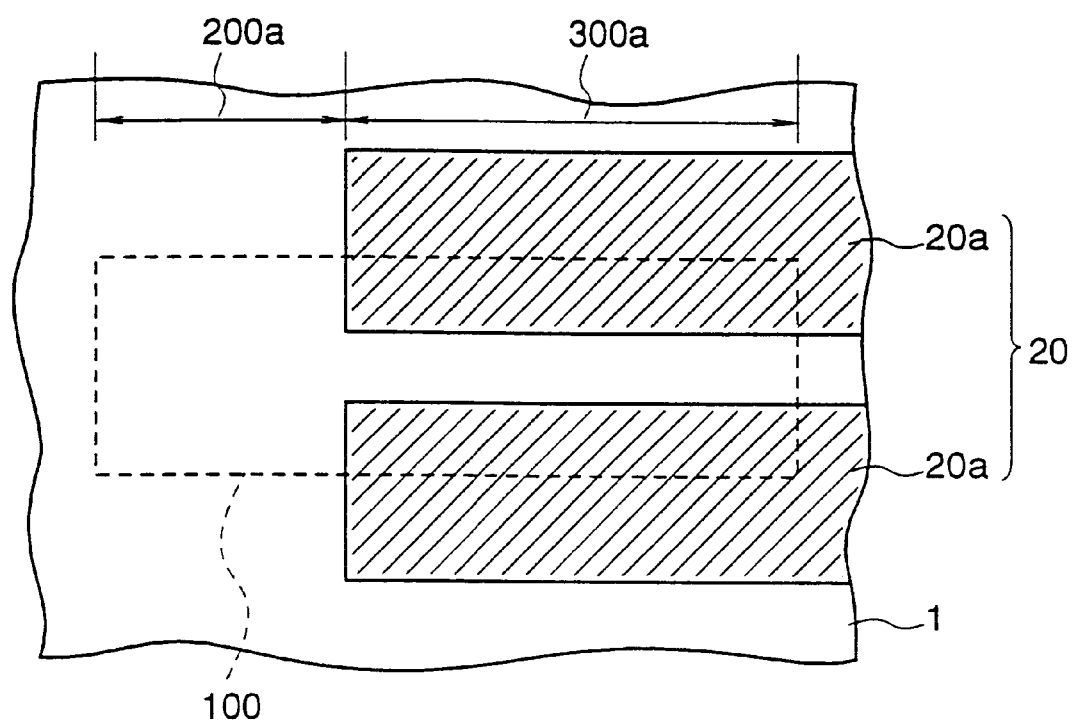
FIG. 3 is a plan view for explaining a principal process step in the method of fabricating the semiconductor laser according to the first embodiment.

FIG. 3 shows a plan view of the substrate (wafer) 1 with the mask pattern 20. In FIG. 3, an element formation region 100 corresponds to a region shown in FIG. 2(a) where a single semiconductor laser will be fabricated. The mask pattern 20 comprises a pair of insulating films (dielectric films) 20a having stripe-shaped (rectangle) surfaces and extending in the direction along which the gain region 300a and the spot size changing region 200a are arranged, i.e., in what becomes the cavity length direction of the laser. Each insulating film 20a has a width of 70 $\mu$m and a length of 1800 $\mu$m along the cavity length direction. Further, these insulating films 20a are disposed parallel to each other with spacing of 50 $\mu$m between them. The direction along which the insulating films 20a extend is <$\bar{1}$10>.

In the step of FIG. 2(b), using the mask pattern 20 as a mask for selective growth, there are successively grown on the substrate 1, the n type GaAs buffer layer 2, the n type AlGaAs lower cladding layer 3, the MQW active layer 4, the p type AlGaAs first upper cladding layer 5, and the p type GaAs cap layer 6 for protecting the surface of the first upper cladding layer 5 from the atmosphere. Preferably, these layers are grown by MOCVD. During the MOCVD growth, since the mask pattern 20 is present on the substrate 101, the growth rate varies on the surface of the substrate 101. That is, the growth rate is higher on the region between the insulating films 20a of the mask pattern 20 in the gain region 300a than on the spot size changing region 200a. Further, on the spot size changing region 200a, the growth rate gradually decreases with distance from the mask pattern 20. As a result, the respective semiconductor layers grown on the substrate 101 have uniform thicknesses in the gain region 300a and, in the spot size changing region 200a, the thicknesses of the semiconductor layers gradually decrease with distance from the gain region 300a.

Figure 15:
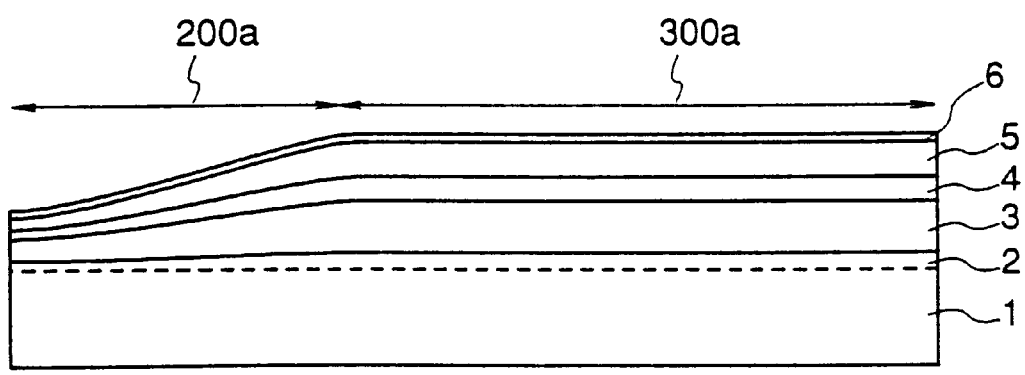
FIG. 15 is a cross-sectional view for explaining a principal process step in the fabrication method according to the first embodiment of the invention.

FIG. 15 is a cross-sectional view taken along a line 15—15 in FIG. 2(b). As shown in FIG. 15, the thicknesses of the grown layers are larger in the gain region 300a with the mask pattern 20 than in the spot size changing region 200a with no mask pattern because the growth rate is higher in the gain region 300a than in the spot size changing region 200a. Further, the thicknesses of the grown layers gradually decrease with distance from the edge of the mask pattern 20.

In the step of FIG. 2(c), after removal of the mask pattern 20, the p type AlGaAs second upper cladding layer 7 and the p type GaAs contact layer 8 are grown over the entire surface of the substrate (wafer) by MOCVD.

In the step of FIG. 2(d), an insulating film comprising SiO$_2$ or the like is deposited over the entire surface and patterned by etching using a patterned resist or the like as a mask, thereby forming an insulating mask pattern 21. This mask pattern 21 comprises a stripe-shaped mask 21a extending in the direction along which the gain region 300a and the spot size changing region 200a are arranged, and two stripe-shaped masks 21b disposed parallel to each other on both sides of the mask 21a at equal spaces. In the gain region 300a, the mask 21a is disposed in the center of a region opposite the region sandwiched between the masks 20a. The width of the mask 21a is about 1 $\mu$m, and the spacing between the mask 21a and each of the masks 21b is about 20 $\mu$m.

In the step of FIG. 2(e), using the mask pattern 21 as a mask for selective etching, the p type GaAs contact layer 8 and the p type AlGaAs second upper cladding layer 7 are wet-etched with a tartaric acid based etchant to a depth of 1.1 $\mu$m from the surface of the contact layer 8. As a result of the wet etching, grooves are formed in regions between the mask 21a and the masks 21b, and the stripe-shaped ridge structure 10 comprising the contact layer 8 and the second upper cladding layer 7 is formed under the mask 21a. Although the thicknesses of the active layer 4 and the first upper cladding layer 5 are not uniform on the surface of the substrate 1 as described above, since the p type GaAs contact layer 8 and the p type AlGaAs second upper cladding layer 7 are grown without using the mask pattern 20, the thicknesses of these layers are approximately uniform on the surface of the substrate 1. Therefore, when the ridge structure 10 is formed by wet-etching the contact layer 8 and the second upper cladding layer 7 over the gain region 300a and the spot size changing region 200a to a prescribed depth, the ridge structure 10 is obtained without exposing the active layer 4 to the atmosphere. Further, the wet etching can be easily controlled because the etching depth is uniform over the surface. In order to control the etching depth when the ridge structure 10 is formed, a very thin etch stopping layer having an etching rate lower than that of the second upper cladding layer 7 may be disposed in advance in a prescribed position where the etching of the second upper cladding layer 7 is to be stopped.

After removal of the mask pattern 21, an insulating film 22, such as SiO$_2$, is deposited over the entire surface by sputtering, and a stripe-shaped aperture 22a having a width of about 1 $\mu$m is formed in the insulating film 22 on the upper flat surface of the ridge structure 10 by photolithography (FIG. 2(f)). Thereafter, the p side electrode 12 is formed on the insulating film 22 in the gain region 300a, contacting the contact layer 8 through the aperture 22a, and the n side electrode 13 is formed on the rear surface of the substrate 1. Finally, the cavity facets 14 are formed by cleaving in the direction perpendicular to the longitudinal direction of the ridge structure 10, and the wafer is divided into individual laser elements, completing a semiconductor laser as shown in FIGS. 1(a) and 1(b).

The operating principle of the semiconductor laser according to the first embodiment will be described. In the gain part 300, holes supplied from the p side electrode 12 are concentrated in the ridge structure 10 which has a trapezoidal cross section perpendicular to the cavity length direction and then efficiently injected into the active layer 4 under the ridge structure 10. Electrons are injected into the active layer 4 from the n side electrode 13. In the active layer 4, holes and electrons recombine to produce light. In the vertical direction, the emitted light is confined in the active layer 4 by the lower cladding layer 3 and the first and second upper cladding layers 5 and 7. In the horizontal direction, the light is confined in the ridge structure 10 due to the distribution of effective refractive indices in the horizontal direction because, on both sides of the ridge structure 10, there exists air having a refractive index smaller than that of a semiconductor layer. The light generated in the gain part 300 is guided through a portion of the active layer 4 opposite the ridge structure 10 and input to the spot size changing part 200.

In the semiconductor laser according to the first embodiment, since the thickness of the active layer 4 gradually decreases in the waveguide direction, i.e., toward the cavity facet 14, in the spot size changing part 200 as shown in FIG. 1(b), the amount of light leaking from the active layer 4 into the lower cladding layer 3 and the upper cladding layers 5 and 7 is large in a region adjacent to the cavity facet 14 where the active layer 4 is very thin. Therefore, in the spot size changing part 200, guided laser light expands in the vertical direction in approaching the cavity facet 14. As a result, the light emitting spot at the cavity facet 14 increases, and the vertical width of far field of laser light emitted from the cavity facet 14 decreases. Accordingly, it is possible to make the far field light pattern approximately circular by reducing the dimension of the far field pattern in the direction perpendicular to the surface of the substrate 1, whereby the coupling efficiency between the laser light and an optical fiber or the like is improved.

Further, in the spot size changing part 200, since laser light is guided so that it expands in the vertical direction in approaching the cavity facet 14, the emission spot of laser light at the cavity facet 14 is increased and the spot size of laser light emitted from the cavity facet 14 is reduced, so that the laser light can be directly applied to an optical fiber or the like. Since it is not necessary to use a lens for reducing the spot size between the optical fiber and the semiconductor laser, the assembly cost is reduced.

Furthermore, since the amount of laser light confined in the active layer 4 is small at the cavity facet 14 of the spot size changing part 200, the light density at the cavity facet 14 is lowered. Therefore, COD due to light absorption at the facet 14 hardly occurs during high-power output operation, resulting in high reliability with the passage of time.

Figure 13:
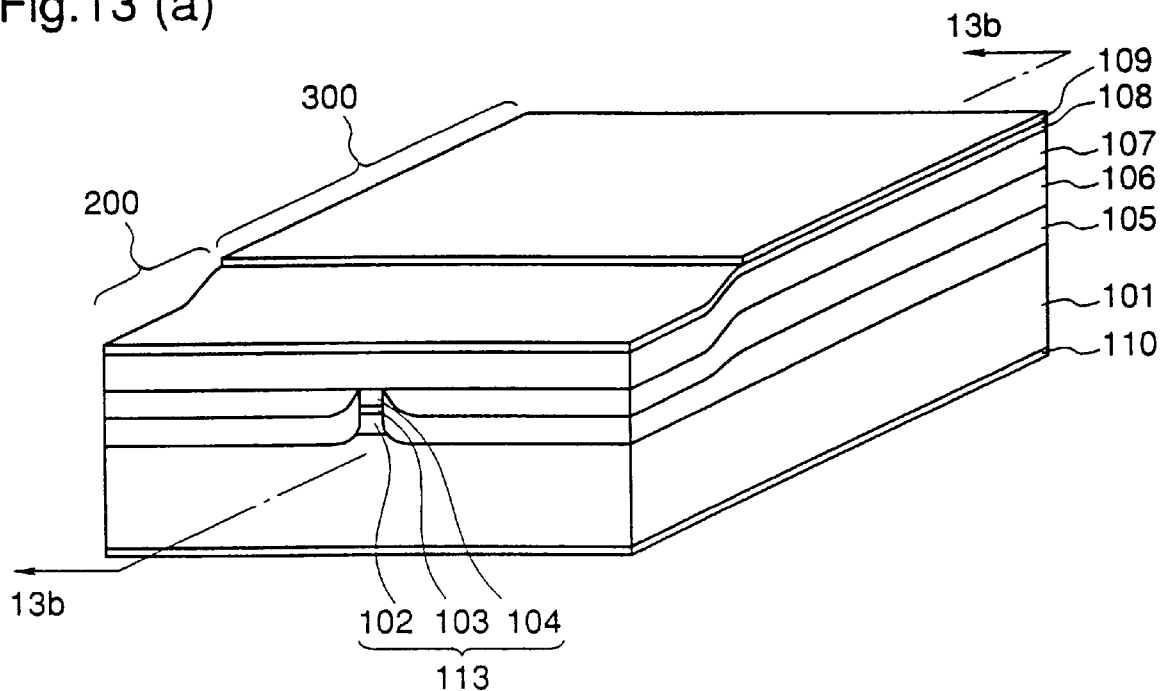
FIGS. 13(a) and 13(b) are a perspective view and a cross-sectional view, respectively, illustrating a spot size changeable semiconductor laser according to the prior art.
Figure 13:
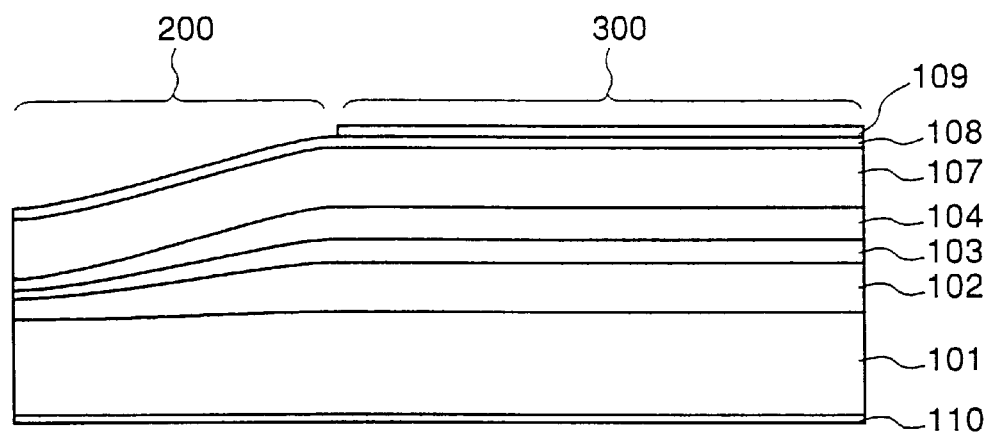
Figure 14:
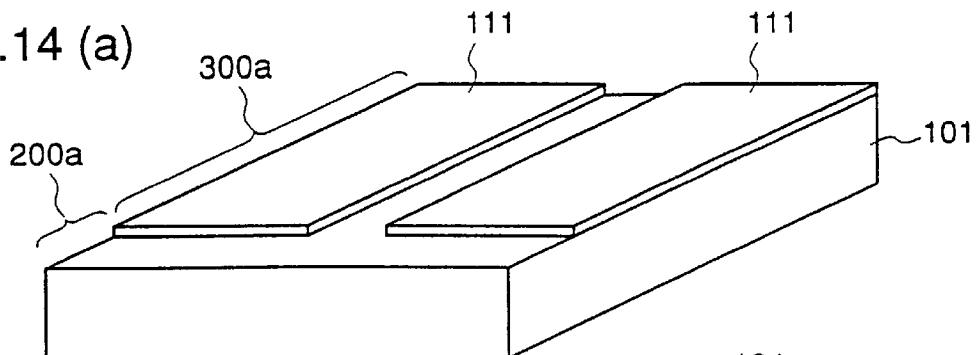
FIGS. 14(a)–14(d)) are perspective views illustrating process steps in a method of fabricating the spot size changeable semiconductor laser shown in FIGS. 13(a) and 13(b).
Figure 14:
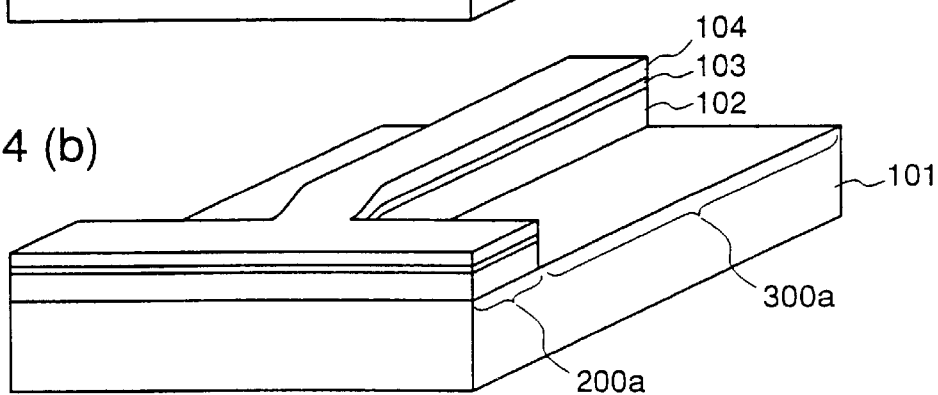
Figure 14:
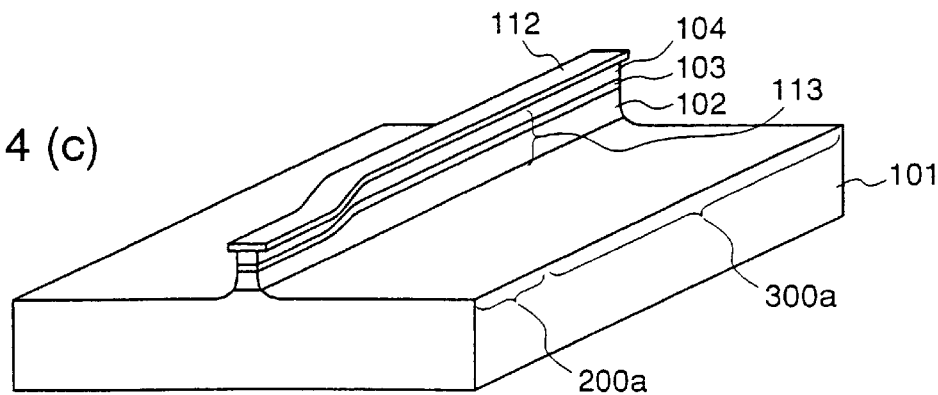
Figure 14:
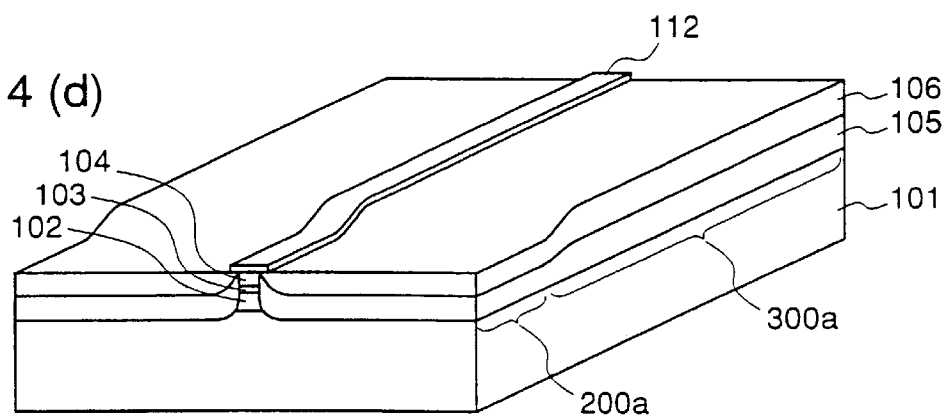

Furthermore, in the semiconductor laser according to the first embodiment, the ridge structure 10 is disposed on the active layer 4, and the current flow is concentrated by the ridge structure 10 into the active layer 4 under the ridge structure 10. In the conventional spot-size changeable semiconductor laser shown in FIGS. 13(a) and 13(b), when the ridge structure for current concentration is fabricated, since the side surfaces of the active layer into which a current will be injected are exposed to air and oxidized, light is absorbed in the oxidized portions of the active layer during operation of the laser, resulting in reduced reliability. In the semiconductor laser according to the first embodiment, however, since the active layer 4 does not have such oxidized portions in a region where current is injected, light absorption does not occur in the region of the active layer 4, and degradation of laser characteristics with the passage of time is avoided, resulting in a highly-reliable semiconductor laser.

Furthermore, in the semiconductor laser according to the first embodiment, since the thickness of the second upper cladding layer 7 in the ridge structure 10 is uniform over the gain part 300 and the spot size changing part 200, the spacing between the active layer 4 in which laser light is guided and the contact layer 8 comprising GaAs which absorbs the laser light guided in the active layer 4 is sufficient even in the spot size changing part 200, thereby preventing the laser light from being absorbed in the contact layer 8. As a result, degradation in laser characteristics is avoided.

As described above, according to the first embodiment of the invention, the semiconductor laser includes the active layer 4, the thickness of which is uniform in the gain part 300 and gradually decreases in the spot size changing part 200 with distance from the gain region 300; the upper cladding layer disposed on the active layer 4, comprising the first upper cladding layer 5 and the second upper cladding layer 7 and having the ridge structure 10, extends in the direction along which the gain part 300 and the spot size changing part 200 are arranged; and the p side electrode 12 is disposed on the upper flat surface of the ridge structure 10 with the contact layer 8 intervening. Therefore, during operation of the laser, current flow is concentrated in the ridge structure 10. In addition, when the ridge structure 10 is fabricated, since portions of the active layer 4 where a current will be injected during operation are not exposed to air, these portions are not oxidized, resulting in a highly reliable semiconductor laser comprising an integrated spot size changing part and gain part.

[Embodiment 2]

Figure 16:
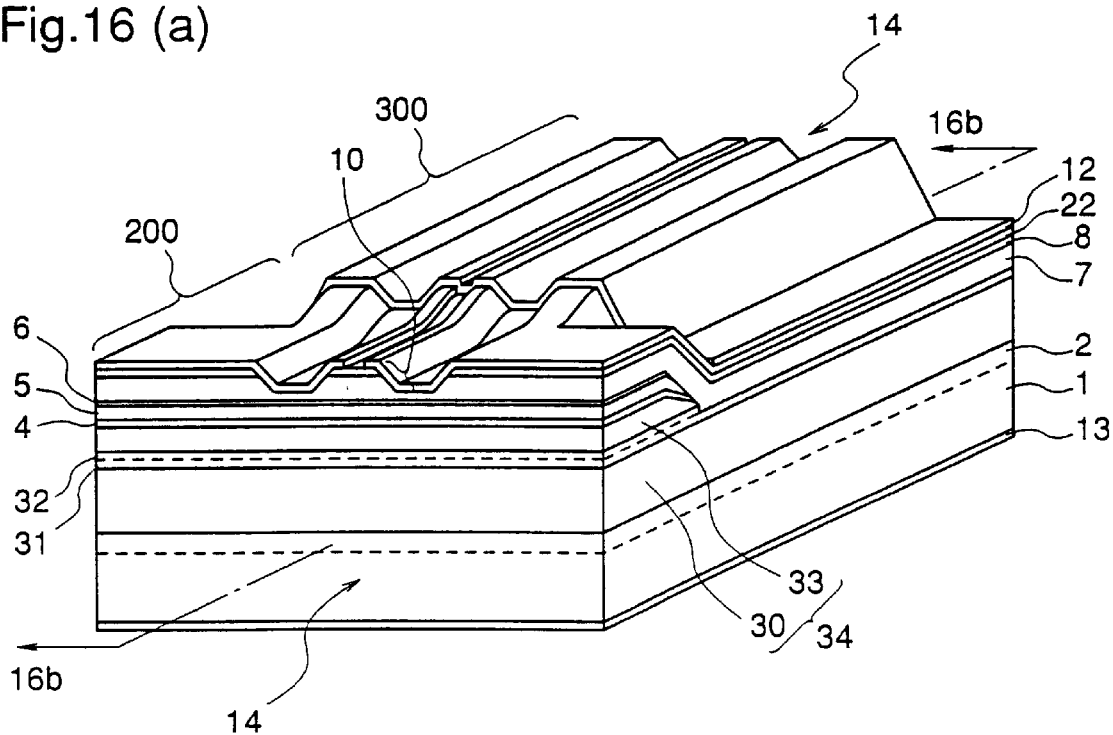
FIGS. 16(a) and 16(b) are a perspective view and a cross-sectional view, respectively, illustrating a semiconductor laser according to the second embodiment of the invention.
Figure 16:
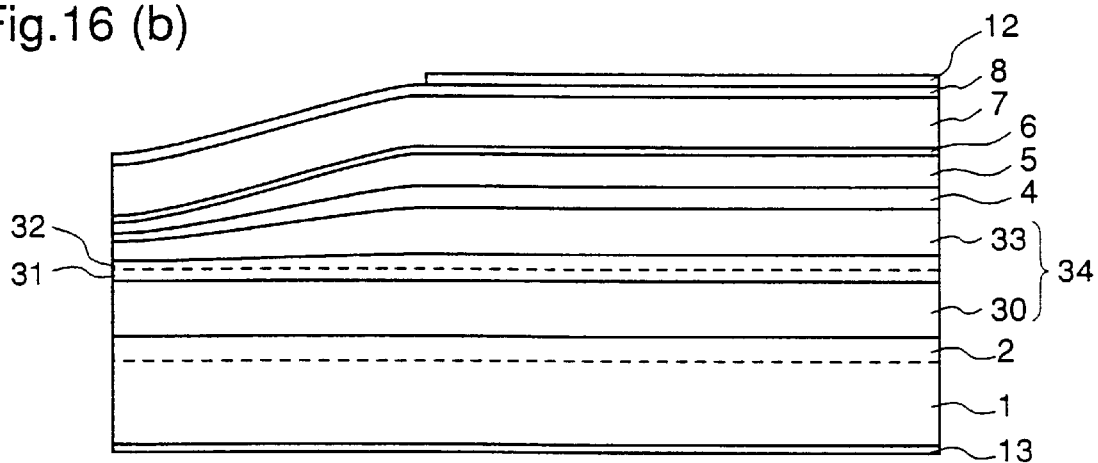

FIG. 16(a) is a perspective view illustrating a semiconductor laser according to a second embodiment of the invention, and FIG. 16(b) is a cross-sectional view of the laser taken along a line 16b—16b in FIG. 16(a). In these figures, the same reference numerals as those shown in FIGS. 1(a) and 1(b) designate the same or corresponding parts. In this second embodiment, in place of the lower cladding layer 3 having different thicknesses in the spot size changing part 300 and in the gain part 200 according to the first embodiment, employed is a lower cladding layer 34 comprising an n type AlGaAs first lower cladding layer 30 and an n type AlGaAs second lower cladding layer 33 disposed on the first lower cladding layer 30. The first lower cladding layer 30 has a carrier concentration of $1\times10^{18}$ cm$^{-3}$ and a uniform thickness over the substrate 1. The second lower cladding layer 33 has a carrier concentration of $1\times10^{18}$ cm$^{-3}$ and a thickness that is uniform in the gain part 300 and gradually decreasing in the spot size changing part 300 with distance from the gain part 300. The second lower cladding layer 33 is significantly thinner than the first lower cladding layer 30. In this first embodiment, the first lower cladding layer 30 is 1.0 μm thick, and the second lower cladding layer 33 is 0.5 μm thick in the gain part 300. The thickness of the second lower cladding layer 33 may be selected in a range from 0.1 μm to 0.5 μm so that the total thickness of the lower cladding layer 34 is about 1.5 μm. Further, a 5 nm thick n type GaAs cap layer 31 having a carrier concentration of $1\times10^{18}$ cm$^{-3}$ and a 5 nm thick n type GaAs buffer layer 32 having a carrier concentration of $1\times10^{18}$ cm$^{-3}$ are disposed between the first lower cladding layer 30 and the second lower cladding layer 31. Since both the cap layer 31 and the buffer layer 32 are very thin, no light absorption occurs in these layers.

Figure 4:
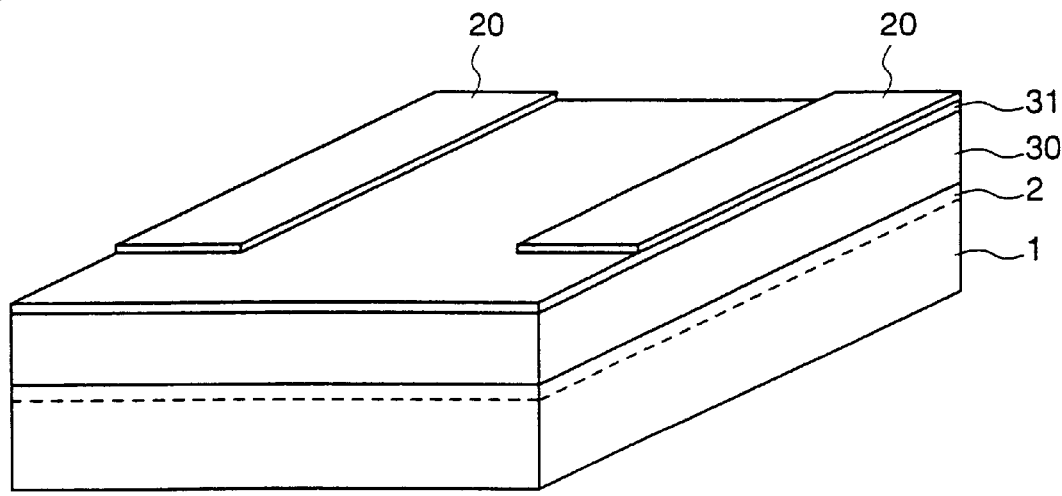
FIGS. 4(a) and 4(b) are perspective views illustrating principal process steps in a method of fabricating a semiconductor laser according to a second embodiment of the invention.
Figure 4:
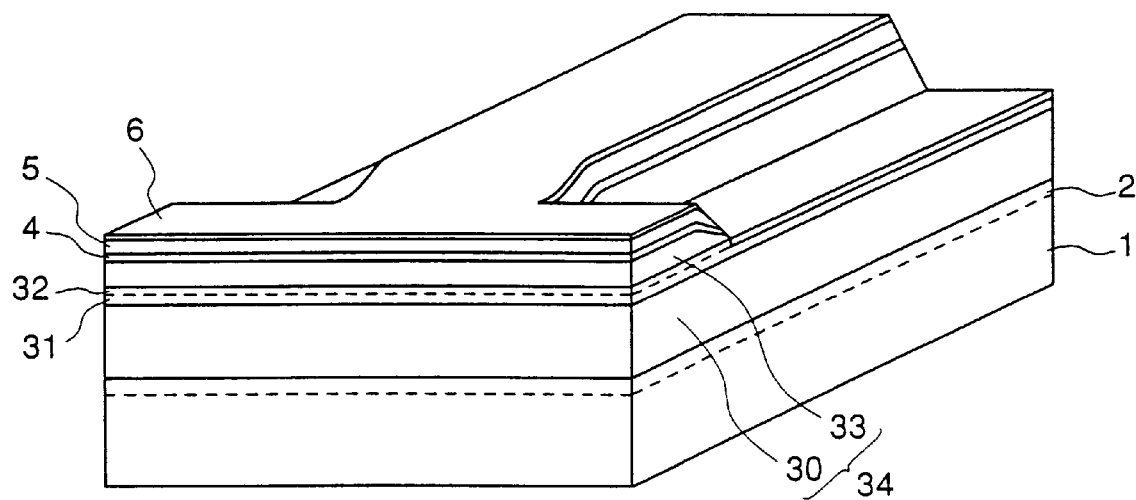

FIGS. 4(a) and 4(b) are perspective views illustrating process steps in a method of fabricating the semiconductor laser according to the second embodiment. In the figures, the same reference numerals as those shown in FIGS. 16(a) and 16(b) designate the same or corresponding parts.

Initially, as illustrated in FIG. 4(a), on the (001) surface of the n type GaAs substrate 1, the n type GaAs buffer layer 2, the n type AlGaAs first lower cladding layer 30, and the n type GaAs cap layer 31 are successively grown by MOCVD. The cap layer 31 prevents the first lower cladding layer 30 from being exposed to air. Thereafter, a mask pattern 20 is formed on the n type GaAs cap layer 31. This mask pattern 20 is identical to the mask pattern used for the selective growth in the first embodiment of the invention.

In the step of FIG. 4(b), the n type GaAs buffer layer 32, the n type AlGaAs second lower cladding layer 33, the MQW active layer 4, the p type AlGaAs first upper cladding layer 5, and the p type GaAs cap layer 6 are successively grown on the cap layer 31 with the mask pattern 20 by MOCVD. Thereafter, the same process steps as already described with respect to FIGS. 1(c)–1(f) are carried out to complete a semiconductor laser as shown in FIGS. 16(a) and 16(b).

Also in this second embodiment, since the active layer 4 grown using the mask pattern 20 has a thickness that gradually decreases in the spot size changing part 200 with distance from the gain part 300, the same effects as provided by the first embodiment are obtained. Further, since the selectively grown n type AlGaAs second lower cladding layer 33 is only 0.5 μm thick, even in its thickest portion, the variation in the thickness of the whole lower cladding layer 34 is smaller than that of the semiconductor laser according to the first embodiment in which the whole lower cladding layer is formed by selective growth. Therefore, the curvature of the active layer 4 in the vertical direction between the spot size changing part 200 and the gain part 300 is reduced, whereby the direction in which laser light is guided through the gain part 30 and the spot size changing part 200 is approximately parallel to the surface of the substrate 1, and the laser light emitting direction is approximately parallel to the surface of the substrate 1 as well.

Moreover, since the thickness of the first lower cladding layer 30 is uniform, the spacing between the active layer 4 in which laser light is guided and the substrate 1 comprising GaAs that will absorb the laser light guided through the active layer 4, is sufficient, even in the spot size changing part 200, thereby preventing the laser light from being absorbed in the substrate 1. As a result, degradation in laser characteristics is avoided.

[Embodiment 3]

Figure 5:
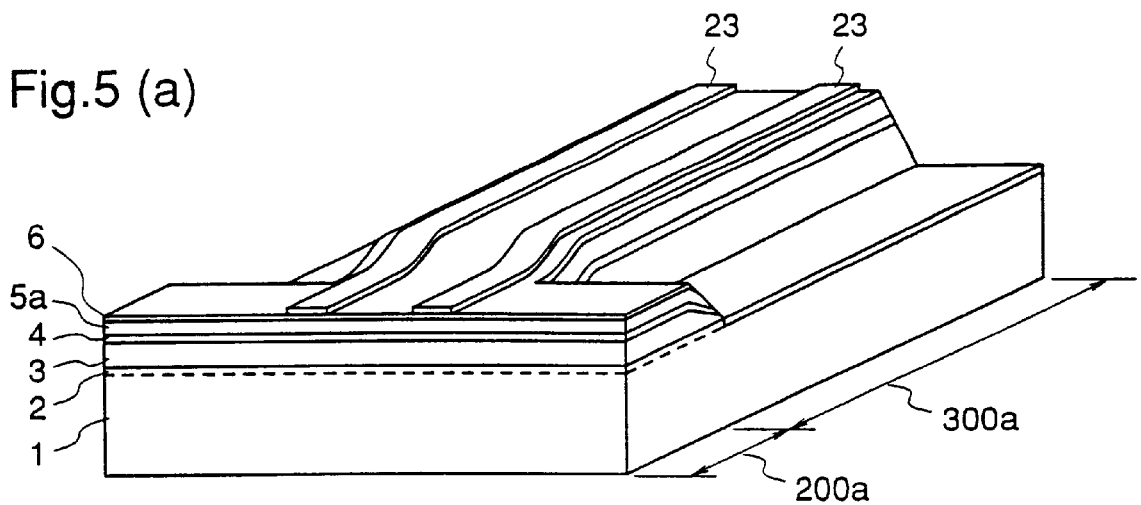
FIGS. 5(a)–5(c) are perspective views illustrating principal process steps in a method of fabricating a semiconductor laser according to a third embodiment of the invention.
Figure 5:
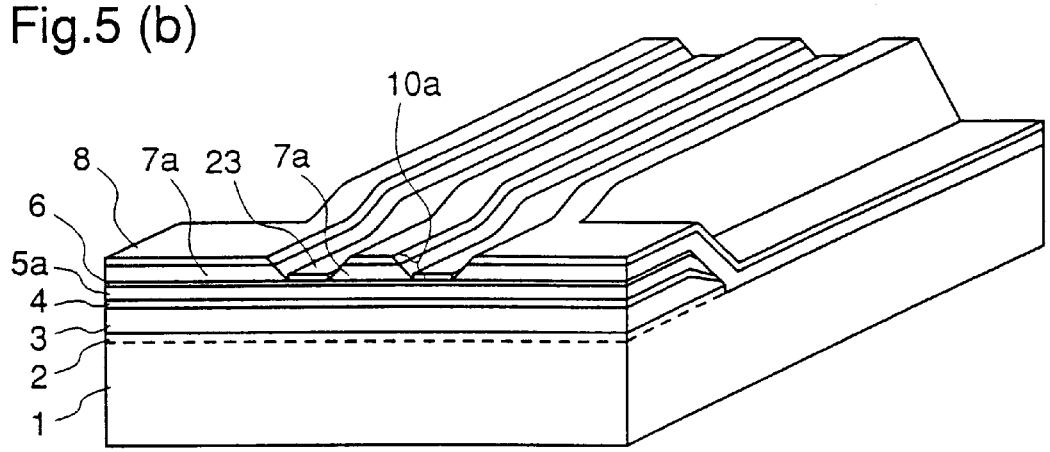
Figure 5:
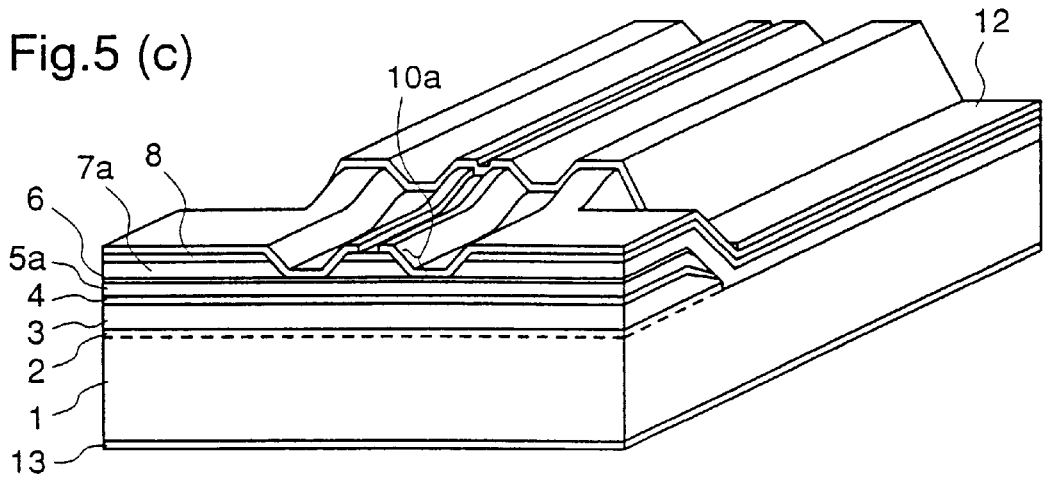

FIGS. 5(a)–5(c) are perspective views illustrating process steps in a method of fabricating a semiconductor laser according to a third embodiment of the invention. In these figures, the same reference numerals as those shown in FIGS. 2(a)–2(f) designate the same or corresponding parts. While in the first embodiment the ridge structure 10 is formed by etching the second upper cladding layer 7 and the contact layer 8, in this third embodiment a ridge structure 10a, comprising a 1.0 μm thick second upper cladding layer 7a having a carrier concentration of 1×10$^{18}$ cm$^{-3}$ and a contact layer 8, is selectively grown on a 0.4 μm thick p type AlGaAs first upper cladding layer 5a having a carrier concentration of 1×10$^{18}$ cm$^{-3}$, whereby a semiconductor laser identical to the semiconductor laser according to the first embodiment is obtained.

The method of fabricating a semiconductor laser according to this third embodiment will be described in more detail using FIGS. 5(a)–5(c).

First of all, the lower cladding layer 3, the active layer 4, the 0.4 μm thick first upper cladding layer 5a, and the cap layer 6 are successively grown on the substrate 1 with the mask pattern 20 in the same process steps as shown in FIGS. 1(a) and 1(b) according to the first embodiment. Thereafter, as shown in FIG. 5(a), an insulating film, such as SiO$_2$, is deposited over the cap layer 6 by sputtering and patterned using exposure and etching techniques, thereby forming two stripe-shaped masks 23 on both sides of a region where the ridge structure 10a will be formed later. The spacing between the masks 23 is about 4 μm, and the width of each mask is about 20 μm. Using the masks 23 for selective growth, the p type AlGaAs second upper cladding layer 7a and the p type GaAs contact layer 8 are grown by MOCVD. Since no crystalline semiconductor material grows on the masks 23, the ridge structure 10a is selectively grown on the region between the masks 23 as shown in FIG. 5(b). Thereafter, the insulating film 22, the p side electrode 12, and the n side electrode 13 are formed in the same manner as described for the first embodiment, resulting in a semiconductor laser as shown in FIG. 5(c).

Also in this third embodiment, the same effects as those provided by the first embodiment are obtained. Further, since the height of the ridge structure 10a depends on the thicknesses of the second upper cladding layer 7a and the contact layer 8 grown by crystal growth, the height of the ridge structure 10a can be controlled with higher precision than when the ridge structure is formed by selectively removing the contact layer and the upper cladding layer in wet etching as described for the first embodiment. Therefore, the uniformity of the height of the ridge structure 10a within the area of the substrate surface is improved, resulting in a high quality semiconductor laser.

[Embodiment 4]

Figure 17:
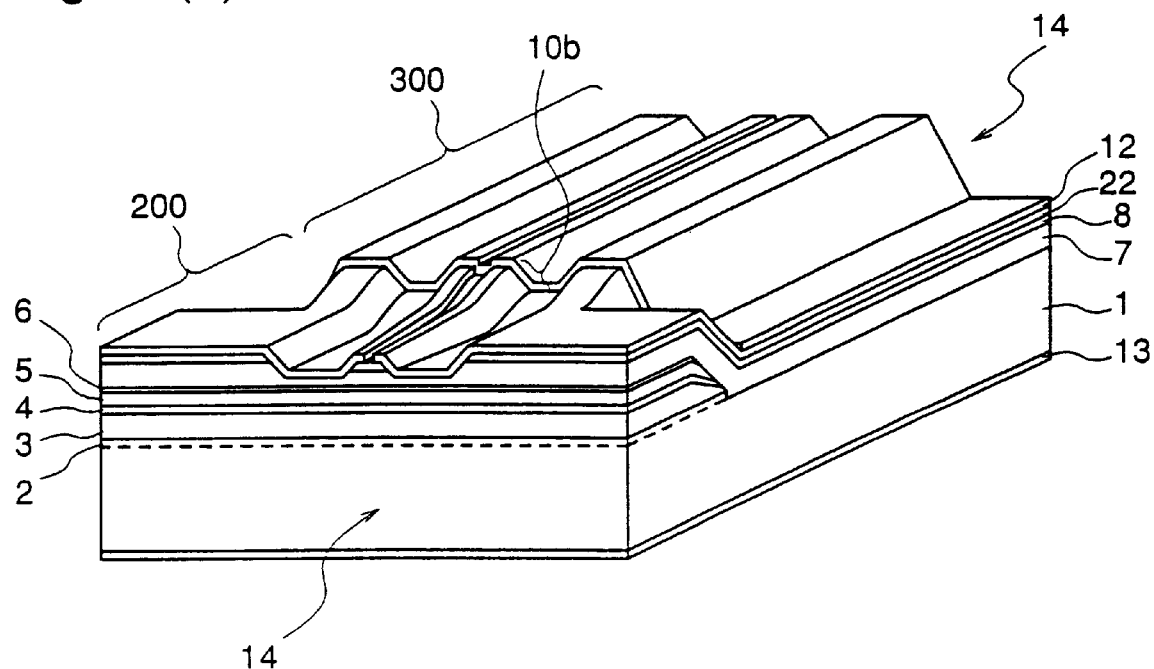
FIGS. 17(a) and 17(b) are a perspective view and a plan view, respectively, illustrating a semiconductor laser according to the fourth embodiment of the invention.
Figure 17:
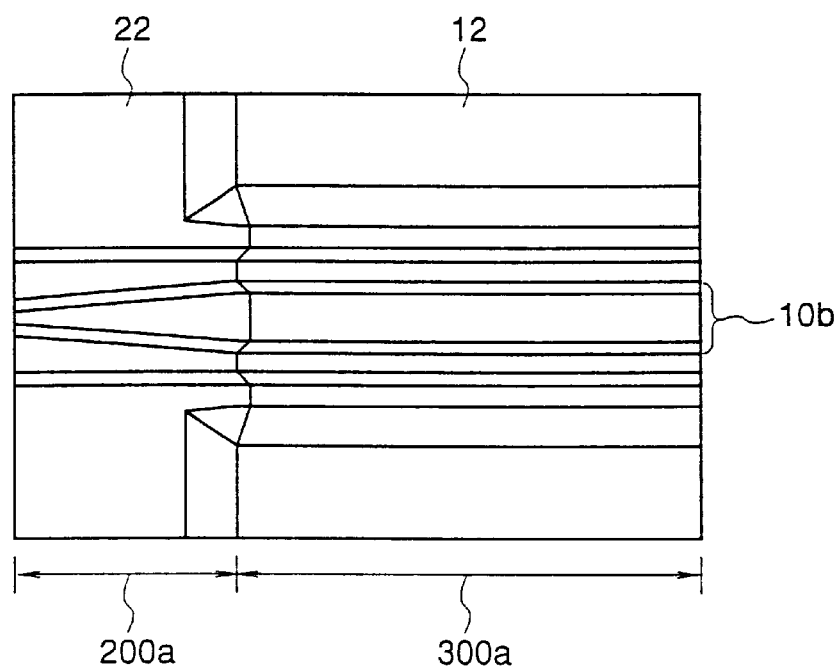

FIGS. 17(a) and 17(b) are a perspective view and a plan view, respectively, illustrating a semiconductor laser according to a fourth embodiment of the invention. In these figures, the same reference numerals as those shown in FIGS. 1(a) and 1(b) designate the same or corresponding parts, and reference numeral 10b designates a ridge structure. The semiconductor laser according to this fourth embodiment includes a stripe-shaped ridge structure 10b, the width of which is uniform in the gain part 300 and gradually decreases in the spot size changing part 200 with distance from the gain part 300.

Figure 6:
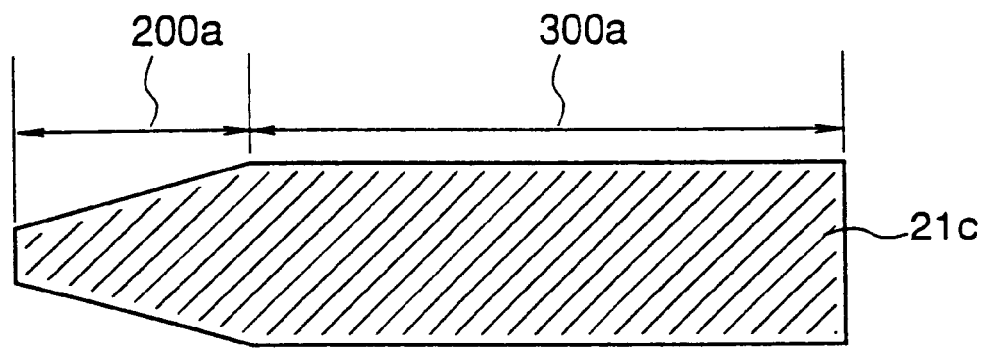
FIG. 6 is a plan view for explaining a principal process step in a method of fabricating a semiconductor laser according to a fourth embodiment of the invention.

FIG. 6 is a plan view of the substrate 1 for explaining a process step in a method of fabricating the semiconductor laser according to this fourth embodiment. In FIG. 6, reference numeral 21c designates a mask pattern comprising an insulating film, such as SiO$_2$, used for forming the ridge structure 10b. Hereinafter, a method of fabricating the semiconductor laser according to the fourth embodiment will be described using FIG. 6.

First of all, the lower cladding layer 3, the active layer 4, the first upper cladding layer 5, and the cap layer 6 are successively grown on the substrate 1 using the mask pattern 20 in the same manner as already described with respect to FIGS. 2(a)–2(c). After removal of the mask pattern 20, the second upper cladding layer 7 and the contact layer 8 are grown. Thereafter, as shown in FIG. 6, the mask pattern 21c is formed on the contact layer 8. The width of the mask pattern 21c is uniform in the gain region 300a, and it gradually decreases in the spot size changing region 200a with distance from the gain region 300a. Using the mask pattern 21c as a mask for selective etching, the contact layer 8 and an upper portion of the second upper cladding layer 7 are selectively etched, thereby forming the ridge structure 10b. Thereafter, in the same process as already described with respect to FIG. 2(f), the insulating film 22, the p side electrode 12, and the n side electrode 13 are formed to complete a semiconductor laser as shown in FIGS. 17(a)–17(b).

In the semiconductor laser according to the first embodiment, the amount of light leakage light in the direction perpendicular to the surface of the substrate 1 (vertical direction) is increased by reducing the thickness of the active layer 4 adjacent to the light emitting facet in the spot size changing part 200, thereby reducing the dimension of the far field laser light in the vertical direction, i.e., making the far field approximately circular. In this fourth embodiment, as well as the width of the active layer 4, the width of the ridge structure 10b in the spot size changing part 200 gradually decreases with distance from the gain part 300, i.e., in approaching the cavity facet 14. Therefore, in the spot size changing part 200 where the ridge width gradually decreases, light confinement in the direction parallel to the surface of the substrate 1 (horizontal direction) becomes weaker with the decrease in the ridge width. As a result, the width of the far field in the horizontal direction can be easily controlled, whereby the effect of making the far field circular is improved.

[Embodiment 5]

Figure 18:
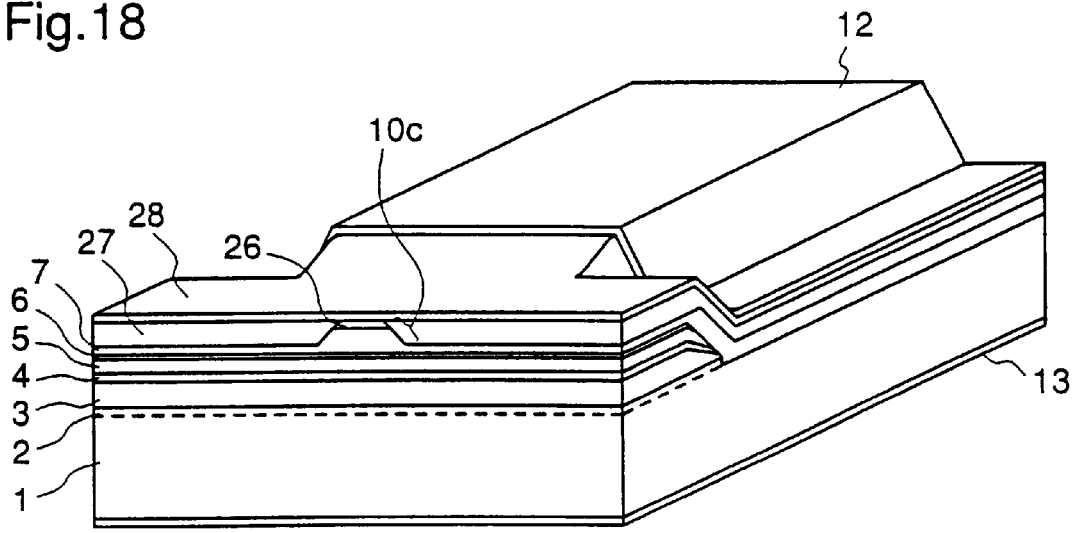
FIG. 18 is a perspective view illustrating a semiconductor laser according to the fifth embodiment of the invention.

FIG. 18 is a perspective view illustrating a semiconductor laser according to a fifth embodiment of the invention. In the figure, the same reference numerals as those shown in FIGS. 1(a) and 1(b) designate the same or corresponding parts. The semiconductor laser according to this fifth embodiment is different from the semiconductor laser according to the first embodiment in that a ridge structure 10c comprises an upper portion of the second upper cladding layer 7 and a p type GaAs cap layer 26 and, on both sides of the ridge structure 10c, 1.5 μm thick n type GaAs current blocking layers 27 are disposed, and a 0.5 μm thick p type GaAs contact layer 28 is disposed on the ridge structure 10c and on the current blocking layers 27.

Figure 7:
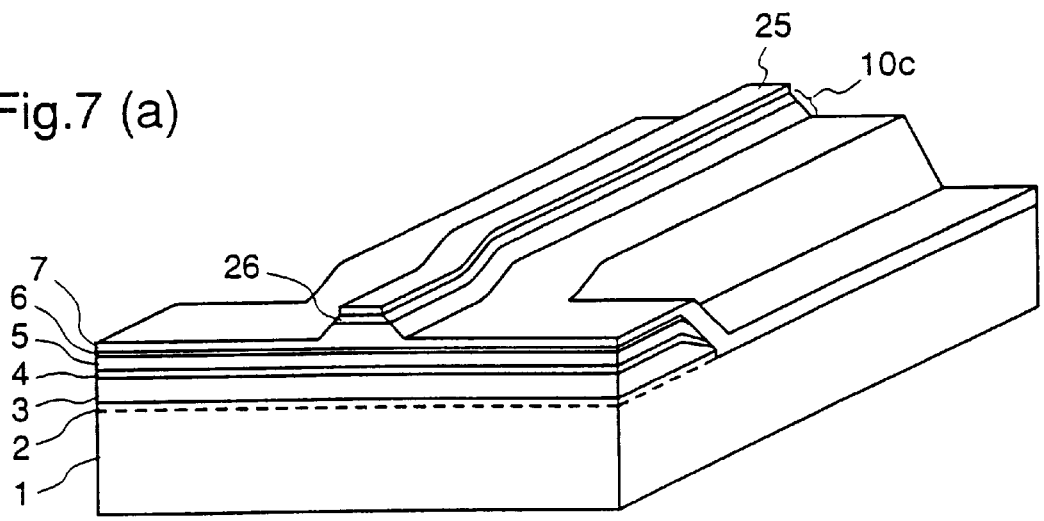
FIGS. 7(a)–7(c) are perspective views illustrating principal process steps in a method of fabricating a semiconductor laser according to a fifth embodiment of the invention.
Figure 7:
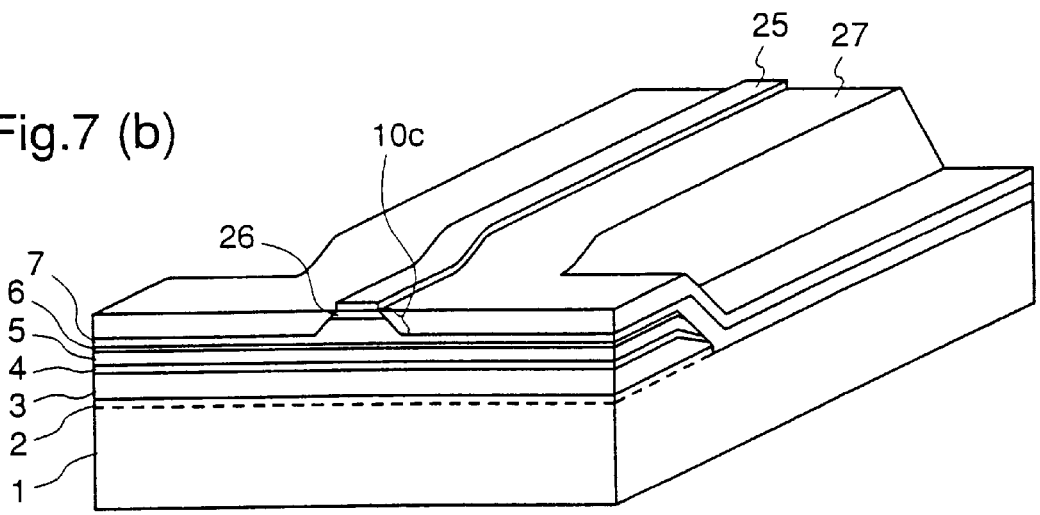
Figure 7:
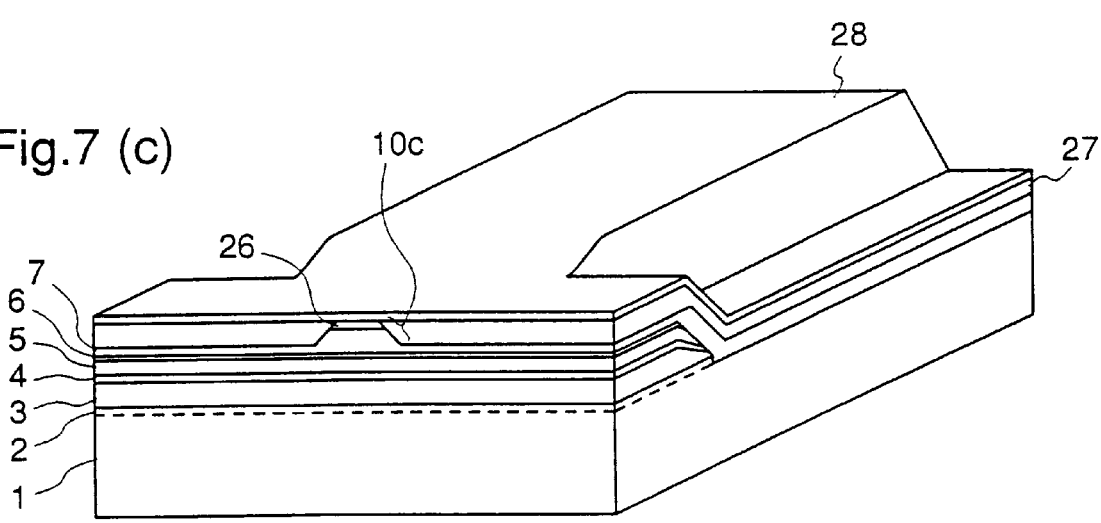

FIGS. 7(a)–7(c) are perspective views illustrating process steps in a method of fabricating the semiconductor laser according to the fifth embodiment. In the figures, the same reference numerals as those shown in FIG. 18 designate the same or corresponding parts.

Hereinafter, the fabrication method will be described using FIGS. 7(a)–7(c).

Initially, the lower cladding layer 3, the active layer 4, the first upper cladding layer 5, and the cap layer 6 are successively grown on the substrate 1 using the mask pattern 20 in the same manner as already described with respect to FIGS. 2(a)–2(c). After removal of the mask pattern 20, the second upper cladding layer 7 and the contact layer 8 are grown.

Thereafter, an insulating film, such as $SiO_2$, is deposited over the entire surface of the cap layer 26 by sputtering and patterned using exposure and etching techniques, thereby forming a stripe-shaped mask 25 about 2 μm wide on a region where a ridge structure is later formed. Thereafter, as shown in FIG. 7(b), the p type GaAs cap layer 26 and an upper portion of the p type AlGaAs cladding layer 7 are wet-etched, using the mask 25 as an etching mask, to a depth of 1.1 μm, thereby forming the ridge structure 10c. Next, as shown in FIG. 7(b), using the mask 25 as a mask for selective growth, the n type GaAs current blocking layer 27 is grown, contacting both sides of the ridge structure 10c. After removal of the mask 25, the p type GaAs contact layer 28 is grown over the entire surface as shown in FIG. 7(c). Finally, the p side electrode 12 and the n side electrode 13 are formed on the contact layer 28 and the rear surface of the substrate 1, respectively, to complete a semiconductor laser as shown in FIG. 18.

A description is given of the operating principle of the semiconductor laser so fabricated. Holes, which are injected from the p side electrode 12 into the gain part 300, are concentrated in the ridge structure 10c having a trapezoidal cross section and efficiently injected into the active layer 4, wherein holes and electrons recombine to produce light.

When the light is guided in the semiconductor laser, it is confined in the active layer 4 by the lower cladding layer 3 and the first and second upper cladding layers 5 and 7 in the vertical direction. In the horizontal direction, the light is confined in the ridge structure 10 due to a difference in refractive indices between the crystalline GaAs constituting the current blocking layers 27 on both sides of the ridge structure 10c and the crystalline AlGaAs constituting the lower part of the ridge structure 10c. That is, in the horizontal direction, the light that reaches the current blocking layer 27 is absorbed in the current blocking layers 27, whereby the light is confined in the ridge structure 10c.

Accordingly, in this fifth embodiment, the same effects as those provided by the first embodiment are achieved. Further, since light is confined using the current blocking layers 27 comprising a crystalline semiconductor in the horizontal direction, the output power of the laser is increased, and light of about 400 mW can be output.

While in this fifth embodiment the current blocking layers 27 comprise a material that absorbs light generated in the active layer 4, the current blocking layers 27 may comprise a material that has a refractive index smaller than that of the ridge structure 10c to vary the effective refractive index in the horizontal direction. Also in this case, it is possible to confine light in the horizontal direction.

[Embodiment 6]

Figure 19:
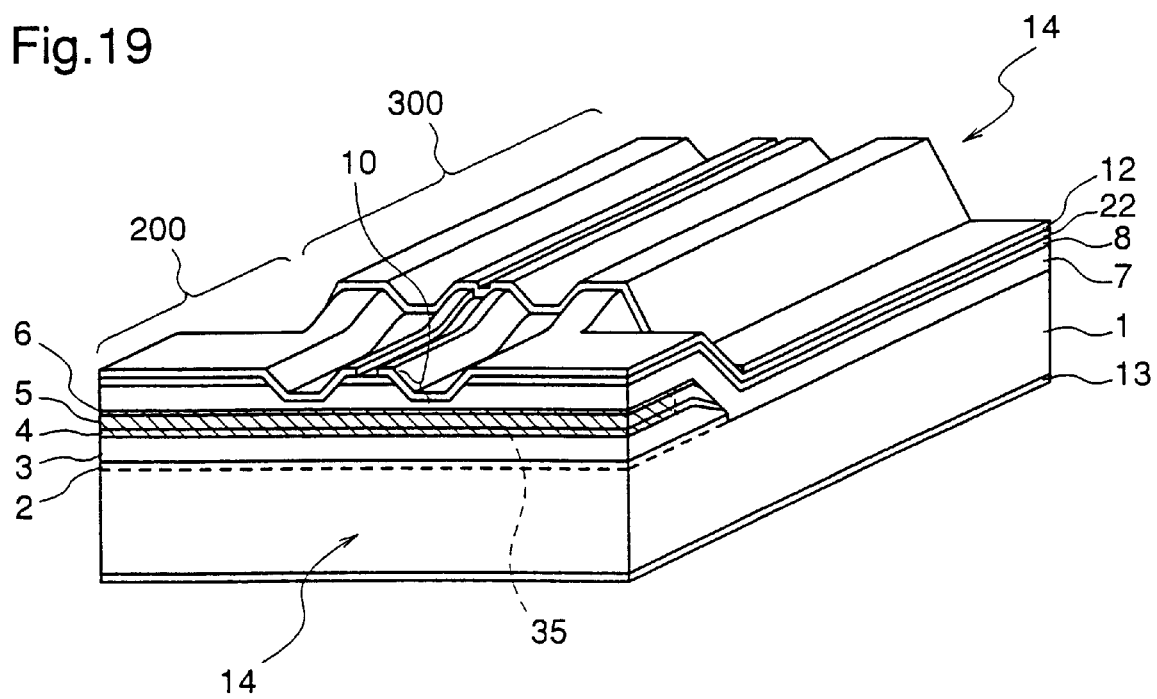
FIG. 19 is a perspective view illustrating a semiconductor laser according to the sixth embodiment of the invention.

FIG. 19 is a perspective view illustrating a semiconductor laser according to a sixth embodiment of the present invention. In FIG. 19, the same reference numerals as those shown in FIGS. 1(a) and 1(b) designate the same or corresponding parts. The semiconductor laser according to this sixth embodiment includes an ion implanted region 35 in the vicinity of the cavity facet 14 of the spot size changing part 200. In the ion implanted region, the MQW structure of the active layer 4 is disordered, producing a window structure in the active layer 4 adjacent to the cavity facet 14.

Figure 8:
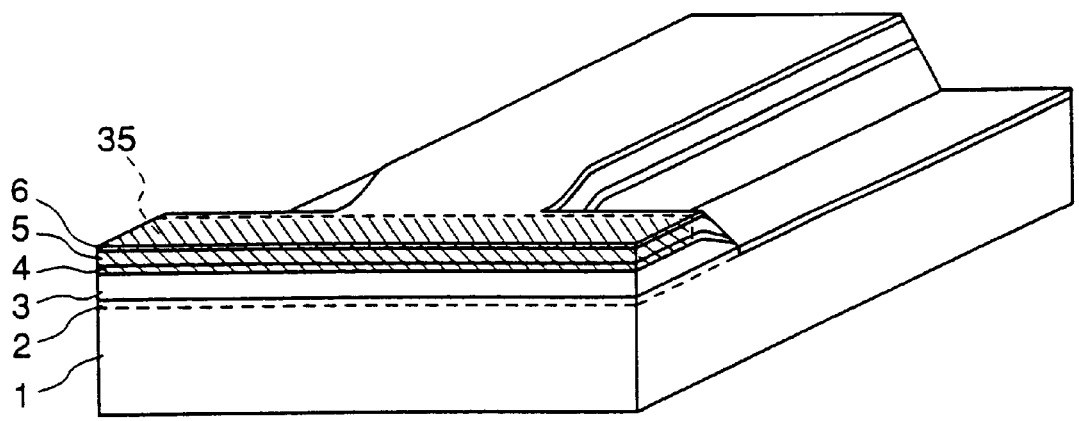
FIG. 8 is a perspective view illustrating a principal process step in a method of fabricating a semiconductor laser according to a sixth embodiment of the invention.

FIG. 8 is a perspective view illustrating a process step in a method of fabricating the semiconductor laser according to the sixth embodiment. In FIG. 8, the same reference numerals as those shown in FIG. 19 designate the same or corresponding parts.

Hereinafter, the fabrication method will be described using FIG. 8.

Initially, the lower cladding layer 3, the active layer 4, the first upper cladding layer 5, and the cap layer 6 are successively grown on the substrate 1 using the mask pattern 20 in the same manner as already described with respect to FIGS. 2(a)–2(b). Thereafter, as shown in FIG. 8, using a resist film or the like as a mask, Si ions are implanted into a region adjacent to what becomes the cavity facet 14 of the laser in the spot size changing region 200a, from the surface of the substrate, until the ions reach the active layer 4, thereby forming the ion implanted region 35. In place of ion implantation, diffusion of Si or Zn ions may be employed. Thereafter, the substrate is annealed to disorder the MQW structure in the MQW active layer 4 in the Si ion implanted region 35, whereby the PL wavelength of the disordered portion of the MQW active layer 4 becomes shorter than the PL wavelength of the non-disordered portion of the MQW active layer 4, resulting in a window structure of the active layer 4 in the ion implanted region 35. Thereafter, as described for the first embodiment, the mask pattern 20 is removed, the second upper cladding layer 7 and the contact layer 8 are successively grown, the ridge structure 10 is fabricated, and the insulating film 22 and the p side and n side electrodes 12 and 13 are fabricated, completing a semiconductor laser as shown in FIG. 19.

According to the sixth embodiment of the invention, since a portion of the MQW active layer 4 adjacent to the cavity facet 14 in the spot size changing part 200 is disordered by ion implantation to make the disordered portion a window structure, absorption of laser light at the cavity facet is reduced, whereby the output power of the laser can be increased without risk of COD.

[Embodiment 7]

Figure 9:
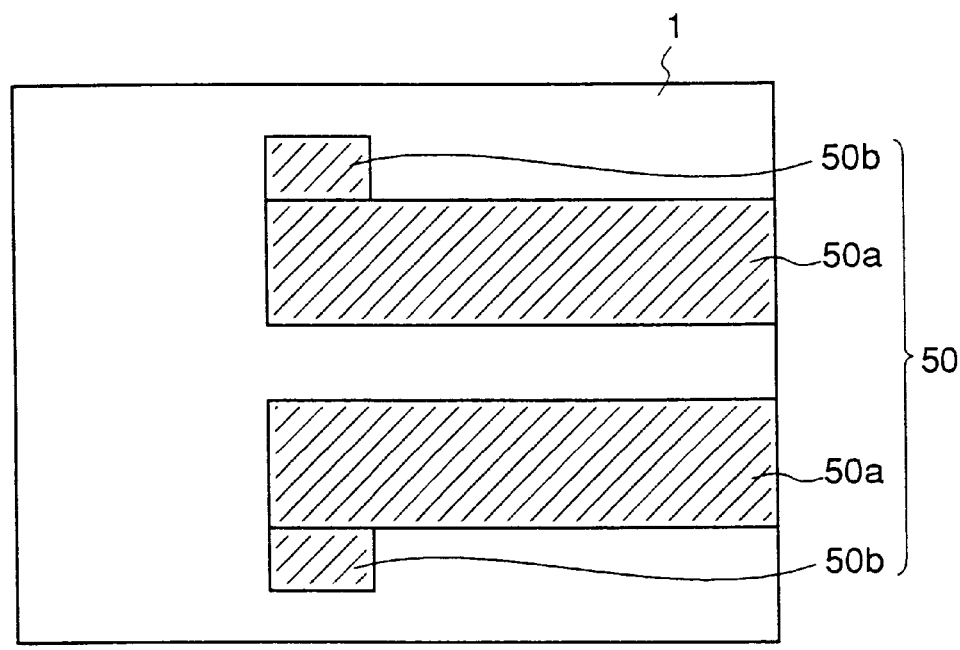
FIG. 9 is a plan view for explaining a principal process step in a method of fabricating a semiconductor laser according to a seventh embodiment of the invention.

FIG. 9 is a plan view illustrating a process step in a method of fabricating a semiconductor laser according to a seventh embodiment of the invention. In this seventh embodiment, a mask pattern 50 comprising insulating films 50a and 50b, such as $SiO_2$ films, is employed for selectively growing the active layer 4.

In the first embodiment of the invention, since the active layer 4 is grown on the substrate 1 with the mask pattern 20 shown in FIG. 2(a), the grown active layer 4 has a uniform thickness in the gain part 300 and gradually decreasing in the spot size changing part 200 with distance from the gain part 300.

Figure 10:
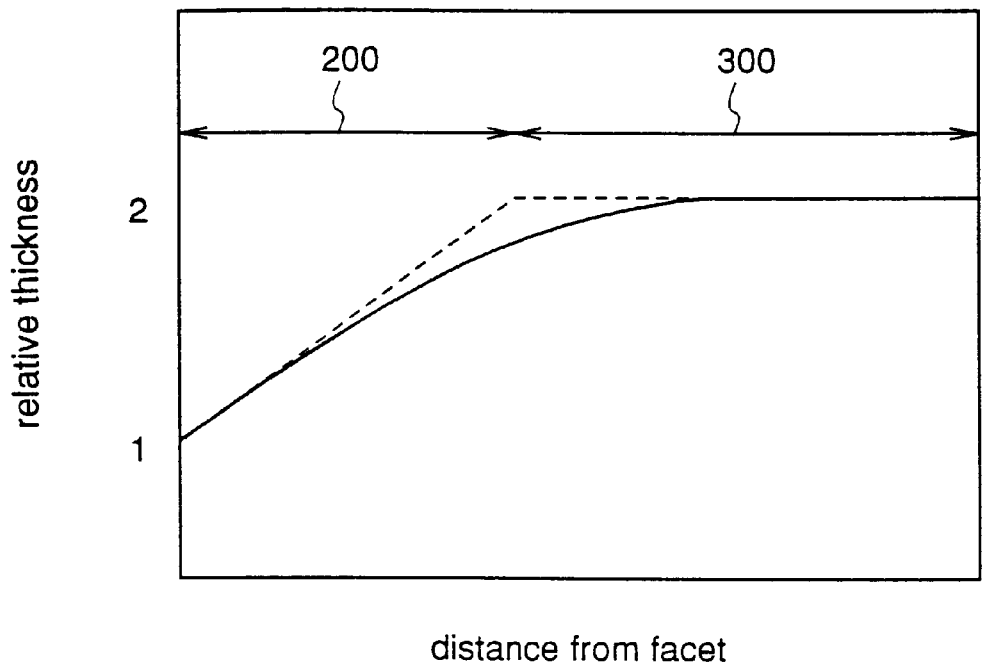
FIGS. 10(a) and 10(b) are diagrams for explaining the fabrication method according to the seventh embodiment.
Figure 10:
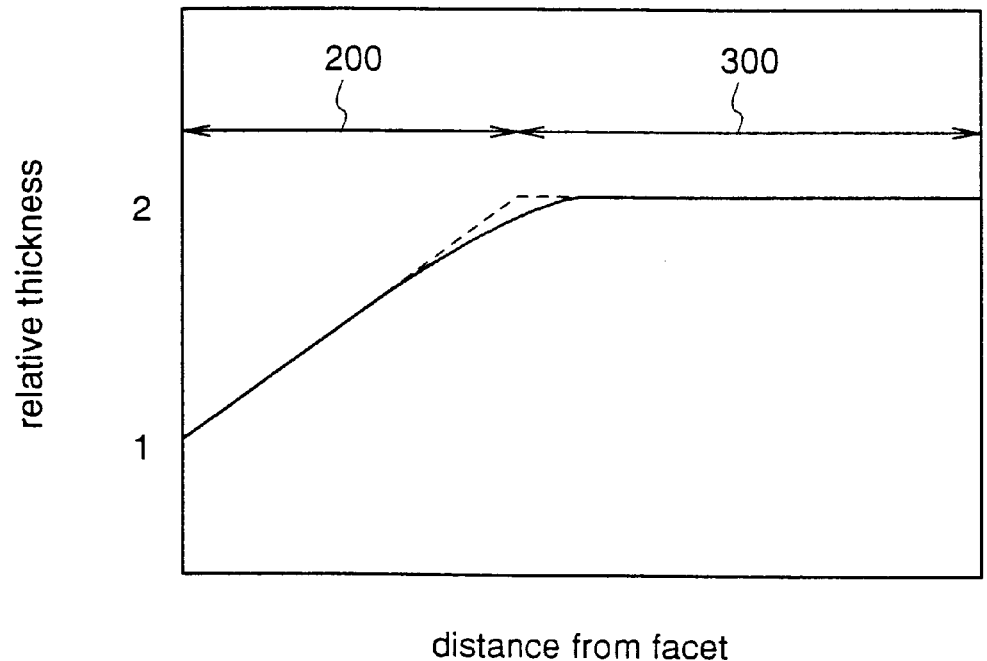
Figure 11:
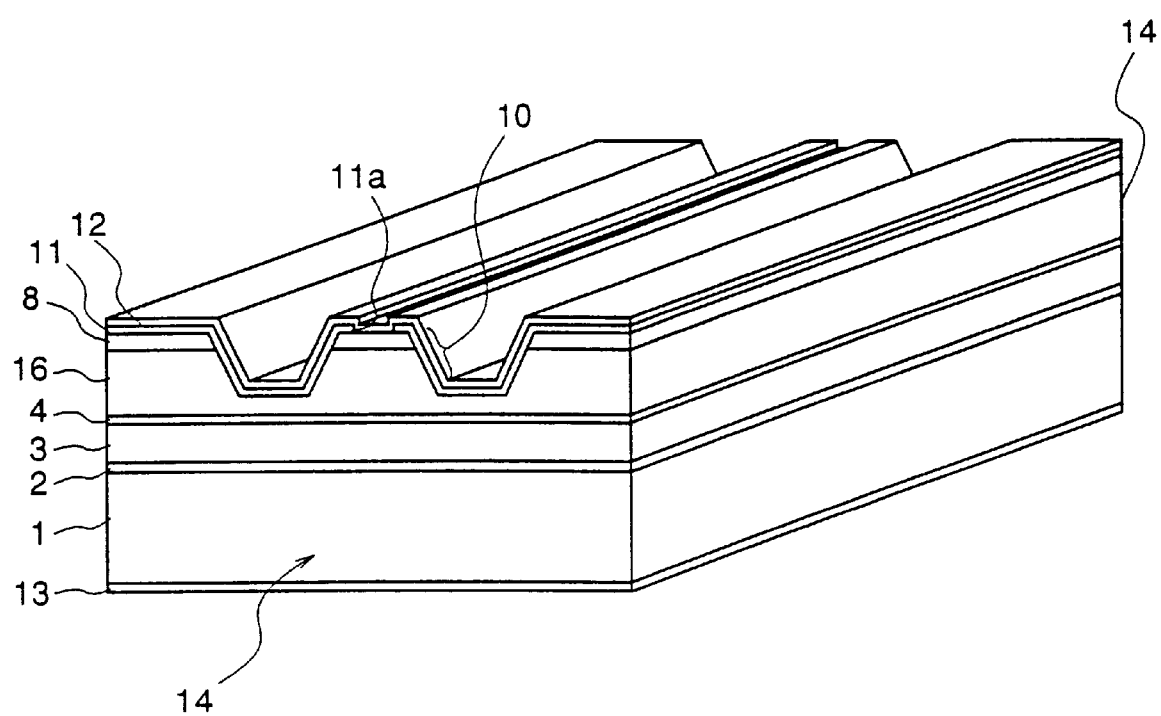
FIG. 11 is a perspective view illustrating a semiconductor laser according to the prior art.
Figure 12:
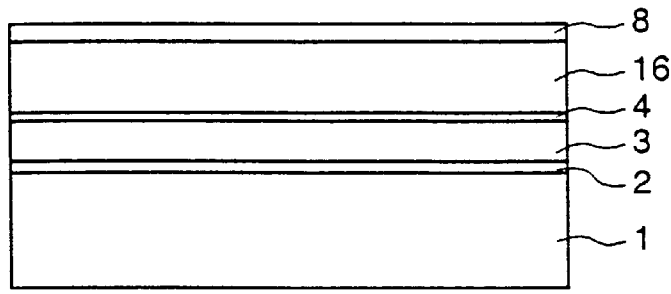
FIGS. 12(a)–12(d)) are cross-sectional views illustrating process steps in a method of fabricating the semiconductor laser shown in FIG. 11.
Figure 12:
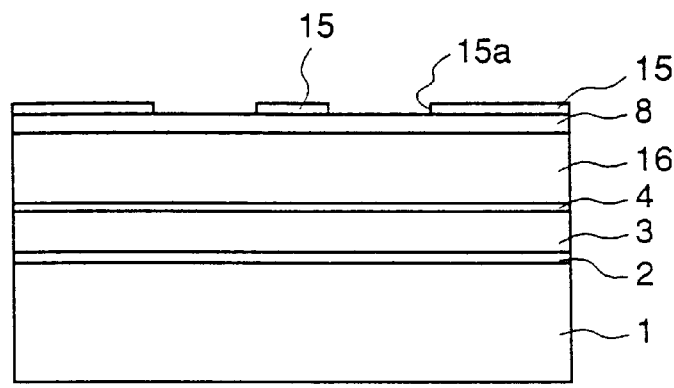
Figure 12:
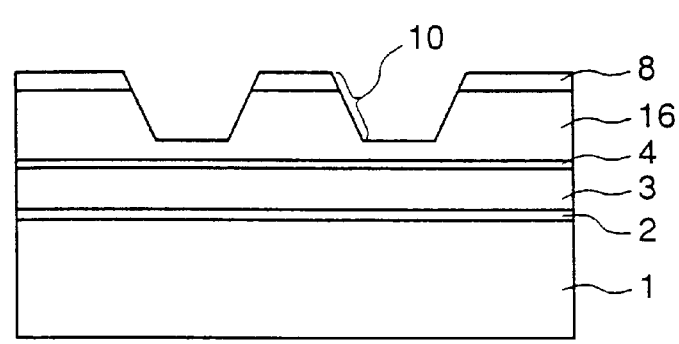
Figure 12:
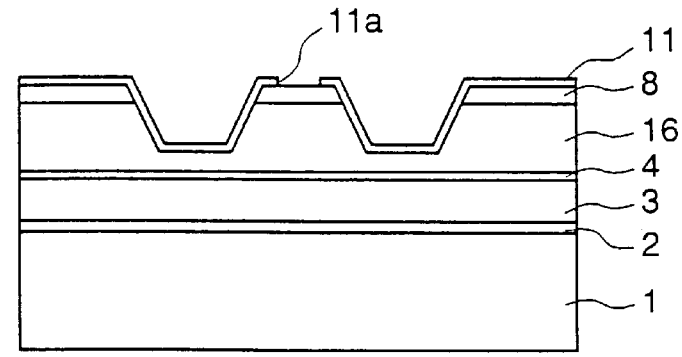

FIG. 10(a) shows the relationship between the distance from the cavity facet 14 of the spot size changing part 200 and the relative thickness of the active layer 4 where the active layer 4 is selectively grown using the mask pattern 20. In the figure, the solid line shows a thickness profile of an actually grown active layer, and the dotted line shows an ideal thickness profile.

As seen from FIG. 10(a), in the selective growth using the mask pattern 20, the thickness profile of the gain part 300 is not completely flat in the vicinity of the spot size changing part 200, so that a current flowing through this non-flat region does not contribute to laser oscillation but degrades the laser characteristics. For example, it causes an increase in the threshold current.

In this seventh embodiment of the invention, to achieve the ideal thickness profile of the active layer 4 shown by the dotted line in FIG. 10(a), when selectively growing the active layer 4 in the fabrication method of the semiconductor laser according to the first embodiment, the mask pattern 50 shown in FIG. 9 is employed, which mask pattern can increase the thickness of the grown active layer 4 at the boundary between the gain part 300 and the spot size changing part 200 as compared with the mask pattern 20 used in the first embodiment.

The mask pattern 50 comprises a pair of stripe-shaped insulating films 50a and a pair of stripe-shaped insulating films 50b. The insulating films 50a are disposed only in the gain region 300a, parallel to each other with a prescribed spacing between them, extending in what becomes the cavity length direction of the laser. The insulating films 50b are disposed in the gain region 300a, contacting outside edges of the insulating films 50a in the vicinity of the spot size changing region 200a and extending in what becomes the cavity length direction of the laser. For example, the insulating film 50a is about 1800 μm long in the cavity length direction and 70 μm wide, and the spacing between the insulating films 50a is 50 μm. The insulating film 50b is 50 μm long in the cavity length direction and 20 μm wide.

Using the above-mentioned mask pattern 50, the semiconductor layers including the active layer 4 are grown on the substrate 1 in the same manner as already described with respect FIGS. 2(a) and 2(b) according to the first embodiment, whereby the active layer 4 has an ideal thickness profile, i.e., an approximately uniform thickness in the gain part 300.

FIG. 10(b) shows the relationship between the distance from the cavity facet 14 of the spot size changing part 200 and the relative thickness of the active layer 4, where the active layer 4 is selectively grown using the mask pattern 50 shown in FIG. 9. In the figure, the solid line shows a thickness profile of an actually grown active layer, and the dotted line shows an ideal thickness profile. It can be seen from FIG. 10(b) that a semiconductor laser having an active layer 4, the thickness of which is approximately uniform in the gain part 300, is obtained.

According to the seventh embodiment of the invention, since the active layer 4 is grown using the mask pattern 50 shown in FIG. 9, the thickness of the active layer 4 is approximately uniform in the gain part 300, whereby a current component that does not contribute to laser oscillation is reduced, resulting in a semiconductor laser with a reduced threshold circuit.

Figure 20:
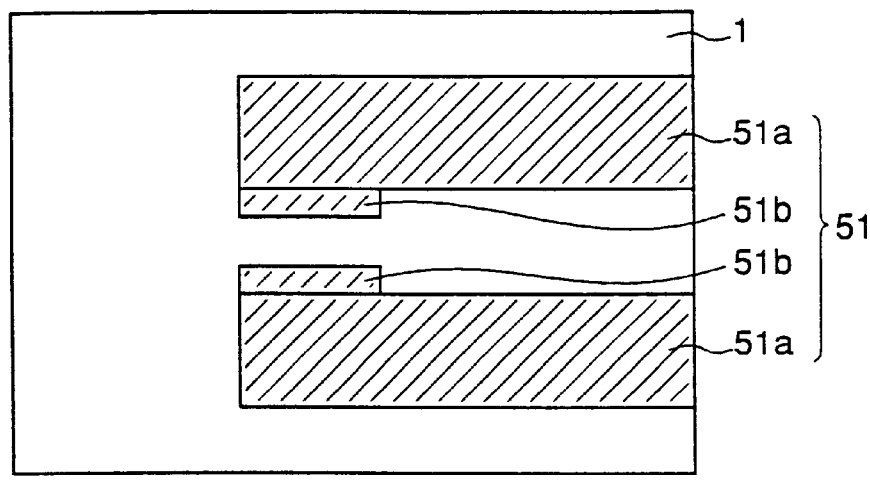
FIGS. 20(a)–20(c) are plan views for explaining principal process steps in the fabrication method according to the seventh embodiment.
Figure 20:
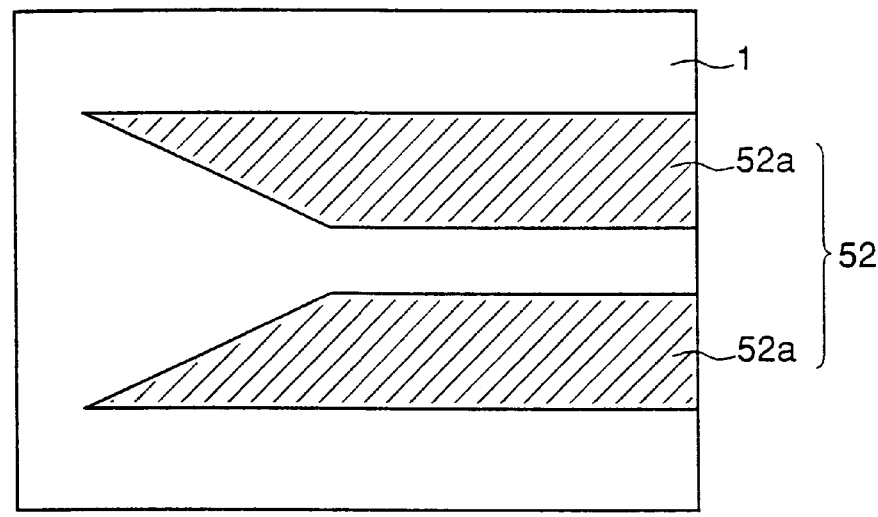
Figure 20:
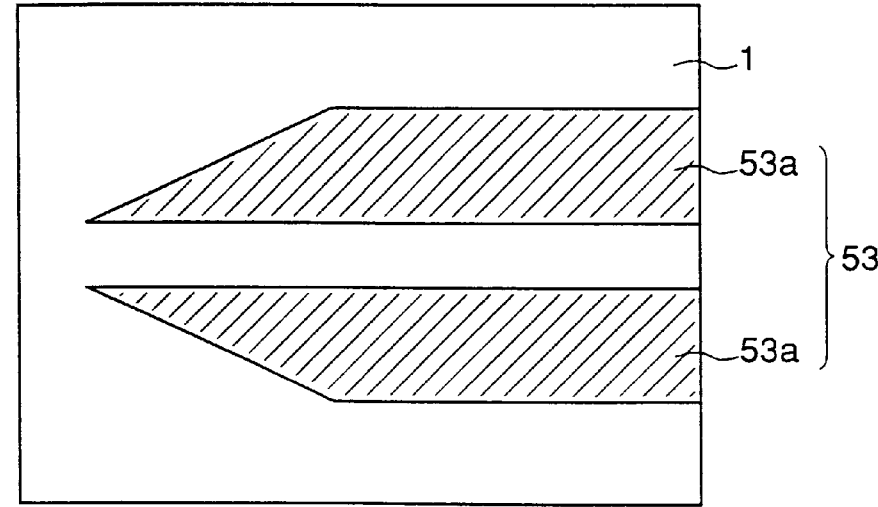
Figure 21:
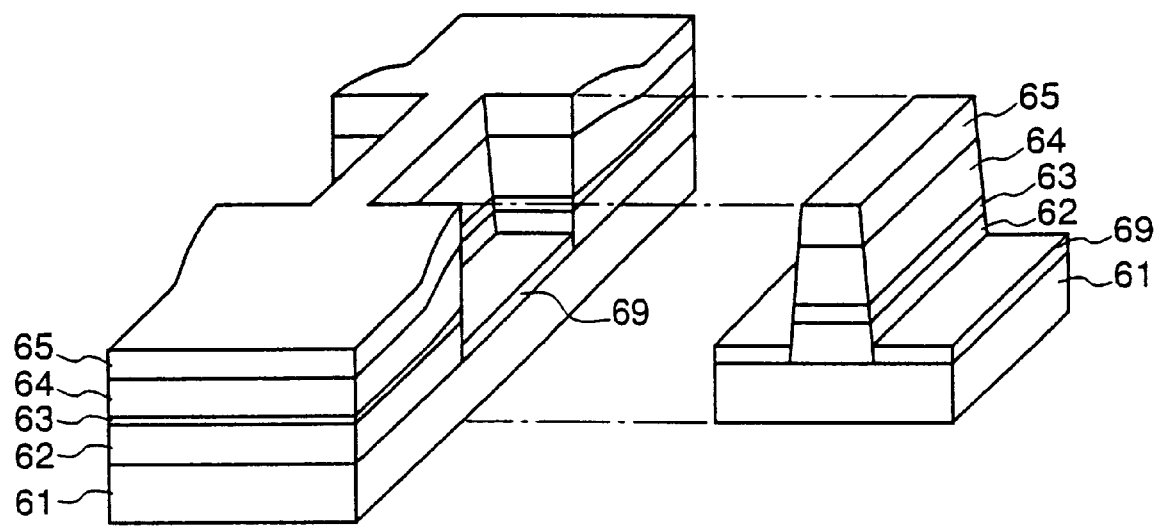
FIG. 21 is a perspective view illustrating a semiconductor laser according to the prior art.

FIGS. 20(a)–20(c) are plan views illustrating mask patterns for selectively growing the active layer 4, employed in place of the mask pattern 50 shown in FIG. 9.

A mask pattern 51 shown in FIG. 20(a) comprises a pair of stripe-shaped insulating films 51a and a pair of stripe-shaped insulating films 51b. The insulating films 50a are disposed only in the gain region 300a, parallel to each other with a prescribed spacing, extending in what becomes the cavity length direction of the laser. The insulating films 51b are disposed in the gain region 300a, contacting inside edges of the insulating films 51a in the vicinity of the spot size changing region 200a and extending in what becomes the cavity length direction of the laser. For example, these insulating films 51a and 51b comprise $SiO_2$. The insulating film 51a is about 1800 μm long in the cavity length direction and 70 μm wide, and the spacing between the insulating films 51a is 50 μm. The insulating film 51b is 50 μm long in the cavity length direction and 10 μm wide. Also in this case, the same effects as mentioned above are achieved.

A mask pattern 52 shown in FIG. 20(b) comprises a pair of stripe-shaped insulating films 52a comprising $SiO_2$ or the like. The insulating films 52a are disposed on the gain region 300a and the spot size changing region 200a, extending in what becomes the cavity length direction of the laser, and not reaching what becomes the cavity facet of the laser. In the gain region 300a, the insulating films 52a are parallel to each other with a prescribed spacing between them, and the width of each film is uniform. In the spot size changing region 200a, the spacing between the insulating films 52a increases with distance from the gain region 300a, and the width of each film decreases with distance from the gain region 300a. For example, the insulating film 52a is about 2000 μm long in the cavity length direction, and its length in the spot size changing region 200a is 100 μm. The insulating film 52a is 70 μm wide in the gain region 300a and in the boundary between the spot size changing region 200a and the gain region 300a. The spacing between the insulating films 52a in the gain region 300a is 4 μm, and the spacing between the cavity facet in the spot size changing region 200a and the insulating film 52a is 50 μm. Also in this case, the same effects as mentioned above are achieved.

A mask pattern 53 shown in FIG. 20(c) comprises a pair of stripe-shaped insulating films 53a comprising $SiO_2$ or the like. The insulating films 53a are disposed on the gain region 300a and the spot size changing region 200a, extending in what becomes the cavity length direction of the laser, and not reaching what becomes the cavity facet of the laser. In the gain region 300a, the insulating films 53a are parallel to each other with a prescribed spacing between them, and the width of each film is uniform. In the spot size changing region 200a, the width of each film decreases with distance from the gain region 300a. For example, the insulating film 53a is about 2000 μm long in the cavity length direction, and its length in the spot size changing region 200a is 100 μm. The insulating film 53a is 70 μm wide in the gain region 300a and in a portion of the spot size changing region 200a adjacent to the gain region 300a. The spacing between the insulating films 53a in the gain region 300a is 4 μm, and the spacing between the cavity facet in the spot size changing region 200a and the insulating film 53a is 50 μm. Also in this case, the same effects as mentioned above are achieved.

While in the first to seventh embodiments emphasis has been placed upon a semiconductor laser having an oscillation wavelength of 0.98 μm, a similar semiconductor laser in which an active layer is modified so that the laser oscillates at another wavelength is also within the scope of the invention.

While in the first to seventh embodiments a semiconductor substrate of n type conductivity is employed, the conductivity type of the substrate may be p type. In this case, n type layers included in the semiconductor laser are replaced with p type layers, and vice versa.

Furthermore, while in the first to seventh embodiments emphasis has been placed upon a Fabry-Perot type semiconductor laser, similar semiconductor lasers of other types, such as a DFB (Distributed Feedback) laser, are also within the scope of the invention.

Furthermore, while in the first to seventh embodiments emphasis has been placed upon a GaAs series semiconductor laser, similar semiconductor lasers comprising other semiconductor materials are also within the scope of the invention.

What is claimed is:

1. A semiconductor laser comprising:

a first conductivity type semiconductor substrate having a front surface and a gain region and a spot size changing region arranged adjacent each other on the front surface;

a first conductivity type lower cladding layer disposed on the front surface of said substrate;

an active layer disposed on said lower cladding layer and having a thickness which is uniform in said gain region and gradually decreases in said spot size changing region with distance from said gain region;

a second conductivity type upper cladding layer disposed on said active layer and having a stripe-shaped ridge, said ridge extending along said gain region and said spot size changing region;

a second conductivity type contact layer disposed on said upper cladding layer;

a first electrode disposed on said ridge of said upper cladding layer on said second conductivity type contact layer; and a second electrode disposed on a rear surface of said substrate.

2. The semiconductor laser of claim 1 wherein:

said lower cladding layer comprises a first lower cladding layer and a second lower cladding layer disposed on said first lower cladding layer;

said first lower cladding layer has a uniform thickness; and said second lower cladding layer has a thickness which is uniform in said gain region and gradually decreases in said spot size changing region with distance from said gain region.

3. The semiconductor laser of claim 2 wherein said second lower cladding layer is thinner than said first lower cladding layer.

4. The semiconductor laser of claim 1 wherein:

said upper cladding layer comprises a first upper cladding layer, and a second upper cladding layer disposed on said first upper cladding layer and having a ridge;

said first upper cladding layer has a thickness which is uniform in said gain region and gradually decreases in said spot size changing region with distance from said gain region; and said second upper cladding layer has a uniform thickness.

5. The semiconductor laser of claim 4 wherein said first upper cladding layer is thinner than said second upper cladding layer.

6. The semiconductor laser of claim 1 wherein said ridge of said upper cladding layer has a width that is uniform in said gain region and gradually decreases in said spot size changing region with distance from said gain region.

7. The semiconductor laser of claim 1 further comprising a first conductivity type current blocking layer disposed on said second upper cladding layer at both sides of said ridge so that said ridge is buried by said current blocking layer.

8. The semiconductor laser of claim 1 wherein:

said active layer has a quantum well structure;

said substrate, lower cladding layer, active layer, and upper cladding layer form a pair of cavity facets that are perpendicular to the direction along which said ridge of said second upper cladding layer extends; and said active layer has a portion where said quantum well structure is disordered, in the vicinity of one of said cavity facet on the side of said spot size changing region.

9. The semiconductor laser of claim 1 wherein said lower cladding layer, said active layer, and said upper cladding layer in said gain region are centrally positioned with respect to a width direction of said substrate.

10. The semiconductor laser of claim 1 wherein said active layer comprises a mixed crystal semiconductor layer comprising at least one of Al and Ga.

11. A method of fabricating a semiconductor laser comprising:

preparing a first conductivity type semiconductor substrate having a gain region and a spot size changing region arranged adjacent each other; and forming, on said substrate, a first conductivity type lower cladding layer, an active layer having a thickness which is uniform in said gain region and gradually decreases in said spot size changing region with distance from said gain region, and a second conductivity type upper cladding layer having a stripe-shaped ridge, said ridge extending in a direction along which said gain region and said spot size changing region are arranged.

12. The method of claim 11 including growing said active layer using a mask pattern for selective growth, said mask pattern comprising two spaced apart insulating films disposed on said substrate, parallel to each other, extending in the direction along which said gain region and said spot size changing region are arranged, each of said insulating films having a first thickness which is uniform in said gain region and a second thickness, smaller than the first thickness, in said spot size changing region.

13. The method of claim 12 wherein said lower cladding layer comprises a first lower cladding layer and a second lower cladding layer and including:

growing said first lower cladding layer over said substrate with a uniform thickness, and selectively growing said second lower cladding layer on said first lower cladding layer using said mask pattern for selective growth.

14. The method of claim 12 wherein said upper cladding layer comprises a first upper cladding layer and a second upper cladding layer and including:

growing said first upper cladding layer on said active layer using said mask pattern for selective growth, removing said mask pattern for selective growth, growing said second upper cladding layer on said first upper cladding layer, and forming an upper portion of said second upper cladding layer into a stripe-shaped ridge by selective etching.

15. The method of claim 12 wherein said upper cladding layer comprises a first upper cladding layer and a second upper cladding layer and including:

growing said first upper cladding layer on said active layer using said mask for selective growth, and after removal of said mask, selectively growing said second upper cladding layer on said first upper cladding layer in a stripe ridge.

* * * * *